US009212951B2

(12) United States Patent
Fukui et al.

(10) Patent No.: US 9,212,951 B2
(45) Date of Patent: Dec. 15, 2015

(54) OBJECT DETECTION DEVICE

(75) Inventors: Suguru Fukui, Osaka (JP); Teruki Hatatani, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 330 days.

(21) Appl. No.: 13/701,867

(22) PCT Filed: Jun. 30, 2011

(86) PCT No.: PCT/JP2011/065063
§ 371 (c)(1),
(2), (4) Date: Dec. 4, 2012

(87) PCT Pub. No.: WO2012/002496
PCT Pub. Date: Jan. 5, 2012

(65) Prior Publication Data
US 2013/0082179 A1  Apr. 4, 2013

(30) Foreign Application Priority Data

Jul. 1, 2010 (JP) .................................. 2010-151392
Apr. 19, 2011 (JP) .................................. 2011-093447

(51) Int. Cl.
*G01J 5/34* (2006.01)
*G01J 1/44* (2006.01)
(Continued)

(52) U.S. Cl.
CPC ...... *G01J 5/34* (2013.01); *G01J 1/44* (2013.01);
*G01J 1/46* (2013.01); *G08B 13/191* (2013.01);
*H01C 7/02* (2013.01); *H01L 2224/48091* (2013.01)

(58) Field of Classification Search
CPC .................................. G01J 5/00; G01J 5/0025
USPC ........................................................ 250/338.3
See application file for complete search history.

(56) References Cited

U.S. PATENT DOCUMENTS 4,418,335 A * 11/1983 Genahr .......................... 340/565
4,706,069 A    11/1987 Tom et al.
(Continued)

FOREIGN PATENT DOCUMENTS

CN    1232235 A    10/1999
JP    H06-094522 A    4/1994
(Continued)

OTHER PUBLICATIONS

English translation of Office Action in corresponding Chinese Patent Application No. 201180028373.4 dated Jun. 16, 2014.
(Continued)

*Primary Examiner* — Marcus Taningco
*Assistant Examiner* — Djura Malevic
(74) *Attorney, Agent, or Firm* — Renner, Otto, Boisselle & Sklar, LLP

(57) ABSTRACT

The object detection device includes: a pyroelectric element configured to output a current signal in response to a change in an amount of infrared light; an I/V conversion circuit including an operational amplifier, a capacitive element serving as a feedback circuit, and a discharging circuit, and configured to convert the current signal to a voltage signal; an A/D conversion circuit configured to convert the voltage signal to a first digital signal; a digital filter configured to extract a detection component having a frequency included in a frequency band associated with an object from a waveform represented by the first digital signal by subjecting the first digital signal to an arithmetic processing, and create a second digital signal representing a waveform of the detection component; a judgment circuit configured to detect the target based on the second digital signal; and a control unit configured to control the discharging circuit based on a period corresponding to a predetermined frequency not greater than a lower limit of the frequency band to discharge electric charges stored in the capacitive element.

18 Claims, 16 Drawing Sheets

(51) Int. Cl.
*G01J 1/46* (2006.01)
*H01C 7/02* (2006.01)
*G08B 13/191* (2006.01)

(56) References Cited

U.S. PATENT DOCUMENTS

| | | | | |
|---|---|---|---|---|
| 4,827,133 | A * | 5/1989 | Zierhut | 250/338.4 |
| 4,868,390 | A * | 9/1989 | Keller et al. | 250/338.3 |
| 4,929,833 | A * | 5/1990 | Smith | 250/338.1 |
| 5,051,799 | A * | 9/1991 | Paul et al. | 375/242 |
| 5,227,795 | A * | 7/1993 | Yamakido et al. | 341/166 |
| 5,347,279 | A * | 9/1994 | Ishihara et al. | 341/166 |
| 5,461,425 | A * | 10/1995 | Fowler et al. | 348/294 |
| 5,631,468 | A * | 5/1997 | Dellacorna | 250/339.05 |
| 5,646,622 | A * | 7/1997 | Kuttner | 341/172 |
| 5,684,303 | A * | 11/1997 | Kim et al. | 250/338.3 |
| 5,764,146 | A * | 6/1998 | Baldwin et al. | 340/567 |
| 5,811,808 | A * | 9/1998 | Cannata et al. | 250/332 |
| 5,844,514 | A * | 12/1998 | Ringh et al. | 341/143 |
| 5,917,187 | A * | 6/1999 | Takada et al. | 250/338.3 |
| 5,949,072 | A * | 9/1999 | Takada et al. | 250/338.3 |
| 6,028,309 | A * | 2/2000 | Parrish et al. | 250/332 |
| 6,243,034 | B1 * | 6/2001 | Regier | 341/166 |
| 6,294,784 | B1 * | 9/2001 | Schubring et al. | 250/338.3 |
| 6,313,462 | B1 * | 11/2001 | Matsuda et al. | 250/338.3 |
| 6,337,647 | B1 * | 1/2002 | Masson et al. | 341/150 |
| 6,340,816 | B1 * | 1/2002 | Micko | 250/338.3 |
| 6,556,158 | B2 * | 4/2003 | Steensgaard-Madsen | 341/131 |
| 6,677,589 | B2 * | 1/2004 | Hironaka et al. | 250/338.3 |
| 7,002,417 | B2 * | 2/2006 | Maunuksela et al. | 331/17 |
| 7,129,487 | B2 * | 10/2006 | Hatatani et al. | 250/338.3 |
| 7,151,474 | B2 * | 12/2006 | Ortmanns et al. | 341/143 |
| 7,230,555 | B2 * | 6/2007 | Dolazza et al. | 341/143 |
| 7,289,054 | B1 * | 10/2007 | Watanabe | 341/156 |
| 7,348,561 | B2 * | 3/2008 | Suntken | 250/338.1 |
| 7,355,539 | B2 * | 4/2008 | Petersen et al. | 341/143 |
| 7,372,392 | B1 * | 5/2008 | Wan et al. | 341/172 |
| 7,423,566 | B2 * | 9/2008 | Chen | 341/143 |
| 7,466,119 | B2 * | 12/2008 | Ito et al. | 324/76.13 |
| 7,514,999 | B2 * | 4/2009 | Killat | 330/260 |
| 7,561,086 | B2 * | 7/2009 | Nys | 341/143 |
| 7,615,753 | B2 * | 11/2009 | Audebert et al. | 250/370.07 |
| 7,616,142 | B1 * | 11/2009 | Mai | 341/143 |
| 7,786,912 | B2 * | 8/2010 | Rangan et al. | 341/143 |
| 7,800,912 | B2 * | 9/2010 | Nakamura et al. | 361/748 |
| 7,928,387 | B2 * | 4/2011 | Dupont et al. | 250/338.1 |
| 8,309,927 | B2 * | 11/2012 | Kimura et al. | 250/338.3 |
| 8,462,145 | B2 * | 6/2013 | Kim et al. | 345/208 |
| 8,692,199 | B2 * | 4/2014 | Huppertz | 250/338.1 |
| 2001/0033240 | A1 * | 10/2001 | Ueno et al. | 341/143 |
| 2003/0047671 | A1 | 3/2003 | Hironaka et al. | |
| 2003/0213910 | A1 * | 11/2003 | Anderson et al. | 250/338.1 |
| 2004/0149910 | A1 * | 8/2004 | Hatatani et al. | 250/338.3 |
| 2005/0285040 | A1 * | 12/2005 | Fukui et al. | 250/338.3 |
| 2006/0231760 | A1 * | 10/2006 | Lee et al. | 250/338.1 |
| 2007/0108385 | A1 * | 5/2007 | Mantese et al. | 250/338.3 |
| 2009/0014653 | A1 * | 1/2009 | Parrish | 250/338.1 |
| 2011/0057106 | A1 * | 3/2011 | Kimura et al. | 250/338.3 |
| 2013/0082179 | A1 * | 4/2013 | Fukui et al. | 250/338.3 |

FOREIGN PATENT DOCUMENTS

| | | |
|---|---|---|
| JP | H06-222159 A | 8/1994 |
| JP | H07-332982 A | 12/1995 |
| JP | 2000-009853 A | 1/2000 |
| JP | 3472906 B | 12/2003 |
| JP | 2006-203009 A | 8/2006 |
| PH | 1-2002-00160 | 11/2005 |
| WO | WO 0205432 A2 * | 1/2002 |
| WO | 2009/136630 A1 | 11/2009 |

OTHER PUBLICATIONS

International Search Report for corresponding International Application No. PCT/JP2011/065063 mailed Aug. 2, 2011.
PCT/ISA/237 for corresponding International Application No. PCT/JP2011/065063 dated Aug. 2, 2011.
Philippine Substantive Examination Report for corresponding Philippine Application No. 1-2012-502400 dated Mar. 6, 2014.
Extended European Search Report for corresponding European Application No. 11800958.8 dated Mar. 6, 2015.

* cited by examiner

FIG. 4
FIG. 5
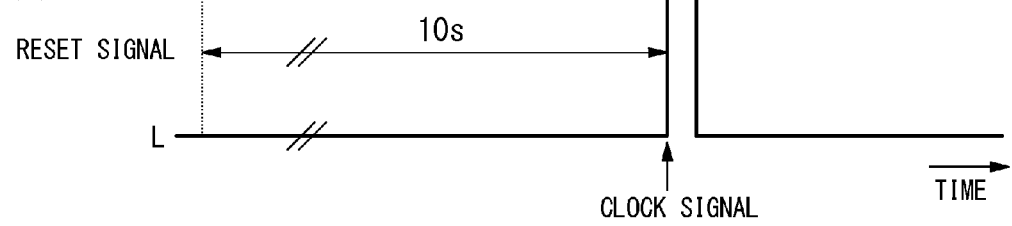

FIG. 14
(a)
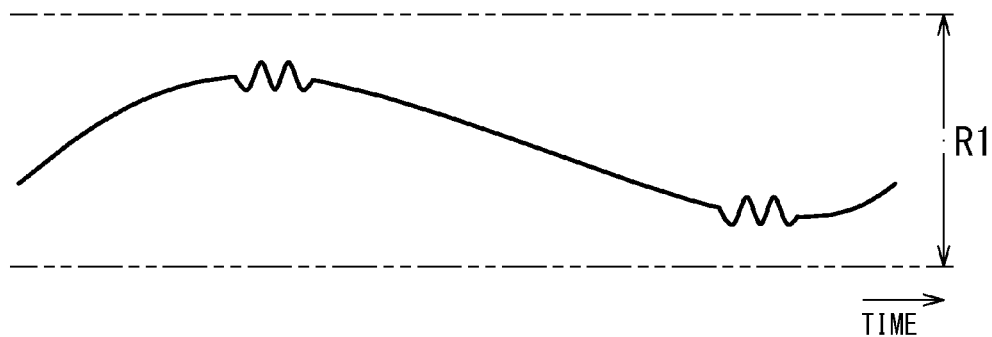
(b)
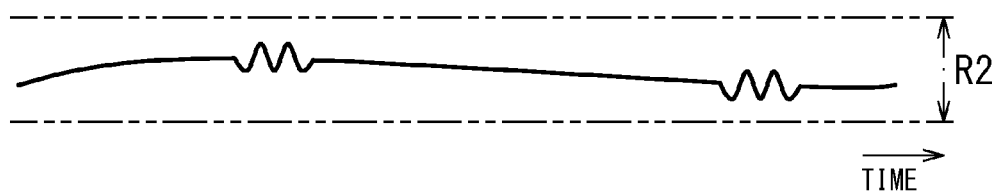

OBJECT DETECTION DEVICE

TECHNICAL FIELD

The present invention relates to an object detection device employing a pyroelectric element.

BACKGROUND ART

In recent years, there have been proposed various electric appliances which detect movement of a human body and perform an efficient operation for the purpose of energy conservation. For example, such an electrical appliance includes an infrared detection device employing a pyroelectric element as a detector for infrared. A normal infrared detection device focuses infrared from a detection area onto the pyroelectric element by use of a lens, for example. A current signal outputted from the pyroelectric element varies in response to a change in an amount of infrared received by the pyroelectric element.

For example, there has been known an infrared detection device 1P as shown in FIG. 17. The infrared detection device 1P includes a pyroelectric element 2, an I/V conversion unit 300, and a voltage amplification unit 400. The I/V conversion unit 300 converts a current signal outputted from the pyroelectric element 2 to a corresponding voltage signal. The voltage amplification unit 400 amplifies an output from the I/V conversion unit 300. In the infrared detection device 1P, the current signal outputted from the pyroelectric element 2 is converted to the corresponding voltage signal by the I/V conversion unit 300 and subsequently is amplified by the voltage amplification unit 400 and thereafter is inputted into a following detection circuit (not shown). Besides, in the configuration illustrated in FIG. 17, the voltage amplification unit 400 functions as a bandpass filter having a passing band which is equivalent to a frequency band (e.g., 0.1 Hz to 10 Hz) of a current signal generated in response to human body detection.

For example, a change in an environment temperature is likely to cause an undesired low-frequency component unrelated to a detection target (e.g., a human body) in the current signal outputted from the pyroelectric element 2. In view of this, there has been proposed the infrared detection device 1P which further includes a DC feedback circuit 200 connected between an output terminal and an input terminal of the I/V conversion unit 300 (see document 1: JP 3472906 B2, paragraphs 0037 to 0044, FIG. 9).

In the infrared detection device 1P disclosed in above document 1, the I/V conversion unit 300 includes a first operational amplifier 31 having an inverting input terminal connected to the pyroelectric element 2. Connected between an output terminal and the inverting input terminal of the first operational amplifier 31 is a capacitor C1. The capacitor C1 serves as a capacitive element for forming an AC feedback circuit. The first operational amplifier 31 has a non-inverting input terminal connected to a reference voltage source 202 configured to generate a reference voltage.

Further, the DC feedback circuit 200 is an integration circuit in which an operation amplifier 201 is connected to a capacitor C200 and a resistor R200. The operational amplifier 201 has a non-inverting input terminal connected to the output terminal of the first operational amplifier 31. The capacitor C200 is connected between an output terminal and an inverting input terminal of the operational amplifier 201. The operational amplifier 201 has the inverting input terminal connected via the resistor R200 to the reference voltage source 202 configured to generate the reference voltage. The operational amplifier 201 has the output terminal connected to the inverting input terminal of the first operational amplifier 31 via an input resistor R201.

The infrared detection device 1P which has the configuration explained in the above sends the undesired low-frequency component to the input resistor R201 in accordance with the output from the operational amplifier 201. Therefore, it is possible to suppress an effect, due to the undesired low-frequency component, on the voltage signal outputted from the I/V conversion unit 300.

However, in the infrared detection device 1P having the aforementioned configuration, since the input resistor R201 is connected to the input terminal of the I/V conversion unit 300, a noise component which occurs at the input resistor R201 may be inputted into the I/V conversion unit 300, and thus an S/N ratio of the I/V conversion unit 300 is likely to be reduced. Especially, to reduce a cut-off frequency (e.g., less than 0.1 Hz) and to suppress a thermal noise of the input resistor R201, the input resistor R201 needs to have a relatively high resistance, for example, a resistance in the range of TΩ (tera-ohms).

In view of downsizing of the infrared detection device 1P, the input resistor R201 is normally constituted by a resistive element incorporated into an IC (integrated circuit). The resistance of such a resistive element greatly depends on the temperature. Therefore, a variation in the resistance caused by a change in the temperature is increased with an increase in the resistance of such a resistive element. A decrease in the resistance of the input resistor R201 may cause an increase in a thermal noise of the input resistor R201. Thus, the S/N ratio of the I/V conversion unit 300 may be reduced.

SUMMARY OF INVENTION

In view of the above insufficiency, the present invention has aimed to propose the object detection device capable of improving an S/N ratio of the I/V conversion circuit as well as suppressing an undesired effect of a low-frequency component on an output of the I/V conversion circuit.

The object detection device of the first aspect in accordance with the present invention is an object detection device for detecting an object in a target space. The object detection device includes: a pyroelectric element configured to output a current signal in response to a change in an amount of infrared light received from the target space; an I/V conversion circuit including an operational amplifier connected to the pyroelectric element, a capacitive element connected to the operational amplifier to serve as a feedback circuit, and a discharging circuit for discharging the capacitive element, the I/V conversion circuit being configured to convert the current signal to a voltage signal and output the voltage signal; an A/D conversion circuit configured to convert the voltage signal to a first digital signal and output the first digital signal; a digital filter configured to extract a detection component having a frequency included in a frequency band associated with the object, from a waveform represented by the first digital signal, by subjecting the first digital signal to an arithmetic processing, and create a second digital signal representing a waveform of the detection component, and output the second digital signal; a judgment circuit configured to judge, based on the second digital signal, whether or not the object exists in the target space; and a control unit configured to control the discharging circuit in such a manner to eliminate a low-frequency component having a frequency not greater than a predetermined frequency not greater than a lower limit of the frequency band from the voltage signal. The control unit is configured to control the discharging circuit based on a reset period corresponding to the predetermined frequency to discharge the electric charges stored in the capacitive element.

In the object detection device of the second aspect in accordance with the present invention, in addition to the first aspect, the control unit includes an oscillation circuit and a reset circuit. The oscillation circuit is configured to create a pulse signal each time the reset period elapses and output the pulse signal to the reset circuit. The reset circuit is configured to create a reset signal based on the pulse signal and output the reset signal to the discharging circuit. The discharging circuit is configured to form a path for discharging the electric charges stored in the capacitive element in response to receipt of the reset signal.

In the object detection device of the third aspect in accordance with the present invention, in addition to the second aspect, the control unit includes a zero crossing detection circuit configured to judge whether or not a magnitude of the waveform represented by the second digital signal is identical to a predetermined value, and to, upon determining the magnitude of the waveform represented by the second digital signal is identical to the predetermined value, output a zero crossing detection signal to the reset circuit. The reset circuit is configured to, in response to first receipt of the zero crossing detection signal subsequent to the receipt of the pulse signal, to output the reset signal to the discharging circuit. The predetermined value is defined as a value corresponding to a magnitude of the voltage signal obtained when electric charges are not stored in the capacitive element.

In the object detection device of the fourth aspect in accordance with the present invention, in addition to the third aspect, the reset circuit is configured to, unless receiving the zero crossing detection signal before a lapse of predetermined time from the receipt of the pulse signal, output the reset signal to the discharging circuit after a lapse of the predetermined time.

In the object detection device of the fifth aspect in accordance with the present invention, in addition to any one of the second to fourth aspects, the control unit includes an abnormality judgment circuit configured to judge whether or not a magnitude of the waveform represented by the second digital signal continuously exceeds a predetermined threshold for a prescribed time period, and to, upon determining the magnitude of the waveform represented by the second digital signal continuously exceeds the predetermined threshold for the prescribed time period, output an abnormality signal to the reset circuit. The reset circuit is configured to output the reset signal to the discharging circuit in response to receipt of the abnormality signal.

In the object detection device of the sixth aspect in accordance with the present invention, in addition to any one of the second to fifth aspects, the judgment circuit is configured to compare a magnitude of the wavelength represented by the second digital signal with a judgment value, and to, upon determining that the magnitude of the wavelength represented by the second digital signal exceeds the judgment value, conclude the object exists. The control unit includes an inhibition circuit configured to judge whether or not the magnitude of the wavelength represented by the second digital signal exceeds an inhibition value less than the judgment value, and to output an inhibition signal to the reset circuit upon determining that the magnitude of the wavelength represented by the second digital signal exceeds the inhibition value, and to output a cancel signal to the reset circuit upon determining that the magnitude of the wavelength represented by the second digital signal does not exceed the inhibition value. The reset circuit is configured such that, once the reset circuit receives the inhibition signal, the reset circuit does not output the reset signal unless receiving the cancel signal.

In the object detection device of the seventh aspect in accordance with the present invention, in addition to any one of the second to sixth aspects, the A/D conversion circuit has an upper limit of the magnitude of the voltage signal which the A/D conversion circuit can convert. The control unit includes a protection circuit configured to judge whether or not the magnitude of the voltage signal exceeds a border value not greater than the upper limit, and to output an excess signal to the reset circuit upon determining the magnitude of the voltage signal exceeds the border value. The reset circuit is configured to output the reset signal to the discharging circuit in response to receipt of the excess signal.

In the object detection device of the eighth aspect in accordance with the present invention, in addition to any one of the first to seventh aspects, the pyroelectric element has a first end and a second end. The operational amplifier includes a first operational amplifier having a first inverting input terminal and a first output terminal, and a second operational amplifier having a second inverting input terminal and a second output terminal. The first inverting input terminal is connected to the first end. The second inverting input terminal is connected to the second end. The capacitive element includes a first capacitive element and a second capacitive element. The first capacitive element is interposed between the first inverting input terminal and the first output terminal. The second capacitive element is interposed between the second inverting input terminal and the second output terminal. The I/V conversion circuit includes a differential circuit configured to output a difference between a voltage of the first output terminal and a voltage of the second output terminal. The voltage signal is defined as a signal representing a waveform of the difference.

In the object detection device of the ninth aspect in accordance with the present invention, in addition to the eighth aspect, the I/V conversion circuit includes an abnormality detection circuit. The abnormality detection circuit is configured to obtain at least one of the voltage of the first output terminal and the voltage of the second output terminal as a detection voltage, and judge whether or not the detection voltage is included in a predetermined range, and output an abnormality detection signal to the reset circuit upon determining that the detection voltage is not included in the predetermined range. The reset circuit is configured to output the reset signal to the discharging circuit in response to receipt of the abnormality detection signal.

The object detection device of the tenth aspect in accordance with the present invention, in addition to any one of the first to ninth aspects, further includes a correction circuit. The correction circuit includes: an adjustment unit configured to create a correction digital signal indicative of a low-frequency component having a frequency not greater than a predetermined frequency not greater than the lower limit of the voltage signal based on the first digital signal; and a correction D/A converter configured to convert the correction digital signal to a correction analog signal and output the correction analog signal to the A/D conversion circuit. The A/D conversion circuit is configured to subtract the correction analog signal from the voltage signal and convert the resultant voltage signal to the first digital signal.

In the object detection device of the eleventh aspect in accordance with the present invention, in addition to the tenth aspect, the A/D conversion circuit includes an integrator, a quantizer, and a D/A converter. The integrator includes a third operational amplifier and a third capacitive element. The third operational amplifier has a third inverting input terminal connected to the I/V conversion circuit to receive the voltage signal, a third non-inverting input terminal, and a third output terminal. The third capacitive element is interposed between the third inverting input terminal and the third output terminal. The quantizer is configured to convert a voltage of the third output terminal to a digital value at predetermined resolution and output the digital value. The first digital signal is defined as a bit sequence indicative of the digital value outputted from the quantizer. The D/A converter is configured to, in response to receipt of the digital value from the quantizer, apply a voltage corresponding to the received digital value to the third inverting input terminal. The correction D/A converter is configured to provide the correction analog signal to the third non-inverting input terminal.

In the object detection device of the twelfth aspect in accordance with the present invention, in addition to the eleventh aspect, the predetermined resolution is one bit. The digital filter includes a first filter unit configured to convert the first digital signal to a third digital signal represented by multiple bits and output the third digital signal, and a second filter unit configured to create the second digital signal by subjecting the third digital signal to an arithmetic process. The adjustment unit is configured to create the correction digital signal by subjecting the third digital signal to an arithmetic process.

In the object detection device of the thirteenth aspect in accordance with the present invention, in addition to the tenth aspect, the correction circuit includes a noise shaper configured to subject the correction digital signal to a noise shaping process to create a noise-shaped correction digital signal and output the noise-shaped correction digital signal to the correction D/A converter. The correction D/A converter is configured to convert the noise-shaped correction digital signal to the correction analog signal.

The object detection device of the fourteenth aspect in accordance with the present invention, in addition to the tenth aspect, further includes an internal power source having a predetermined voltage. The correction D/A converter is configured to create the correction analog signal by use of the predetermined voltage of the internal power source. The operational amplifier has a non-inverting input terminal, an inverting input terminal, and an output terminal. The capacitive element is interposed between the non-inverting input terminal and the output terminal. The inverting input terminal is connected to the pyroelectric element. The internal power source is electrically connected to the non-inverting input terminal such that a reference voltage is applied to the non-inverting input terminal.

In the object detection device of the fifteenth aspect in accordance with the present invention, in addition to the tenth aspect, the A/D conversion circuit includes an integrator, a quantizer, and a D/A converter. The integrator includes a third operational amplifier and a third capacitive element. The third operational amplifier has a third inverting input terminal connected to the I/V conversion circuit to receive the voltage signal, a third non-inverting input terminal receiving a reference voltage, and a third output terminal. The third capacitive element is interposed between the third inverting input terminal and the third output terminal. The quantizer is configured to convert a voltage of the third output terminal to a digital value at predetermined resolution and output the digital value. The first digital signal is defined as a bit sequence indicative of the digital value outputted from the quantizer. The D/A converter is configured to, in response to receipt of the digital value from the quantizer, apply a voltage corresponding to the received digital value to the third inverting input terminal. The correction D/A converter is configured to provide the correction analog signal to the third inverting input terminal.

In the object detection device of the sixteenth aspect in accordance with the present invention, in addition to any one of the first to fifteenth aspects, the A/D conversion circuit is configured to convert the voltage signal to the first digital signal based on $\Delta\Sigma$ conversion.

In the object detection device of the seventeenth aspect in accordance with the present invention, in addition to any one of the first to sixteenth aspects, the digital filter is configured to output the digital value indicative of the second digital signal in a serial method.

In the object detection device of the eighteenth aspect in accordance with the present invention, in addition to the seventeenth aspect, the serial method is a BMC method.

BRIEF DESCRIPTION OF DRAWINGS

FIG. 4 is a time chart illustrating the operation of the object detection device of the first embodiment, FIG. 5 is a time chart illustrating the other operation of the object detection device of the first embodiment, FIG. 14 is an explanatory diagram illustrating the operation of the object detection device of the above third embodiment.

DESCRIPTION OF EMBODIMENTS

First Embodiment

The infrared detection device 1 of the present embodiment is defined as an object detection device for detecting an object in a target space (detection area). In the present embodiment, the object is a human body. In short, the infrared detection device 1 is a human sensor.

Figure 2:
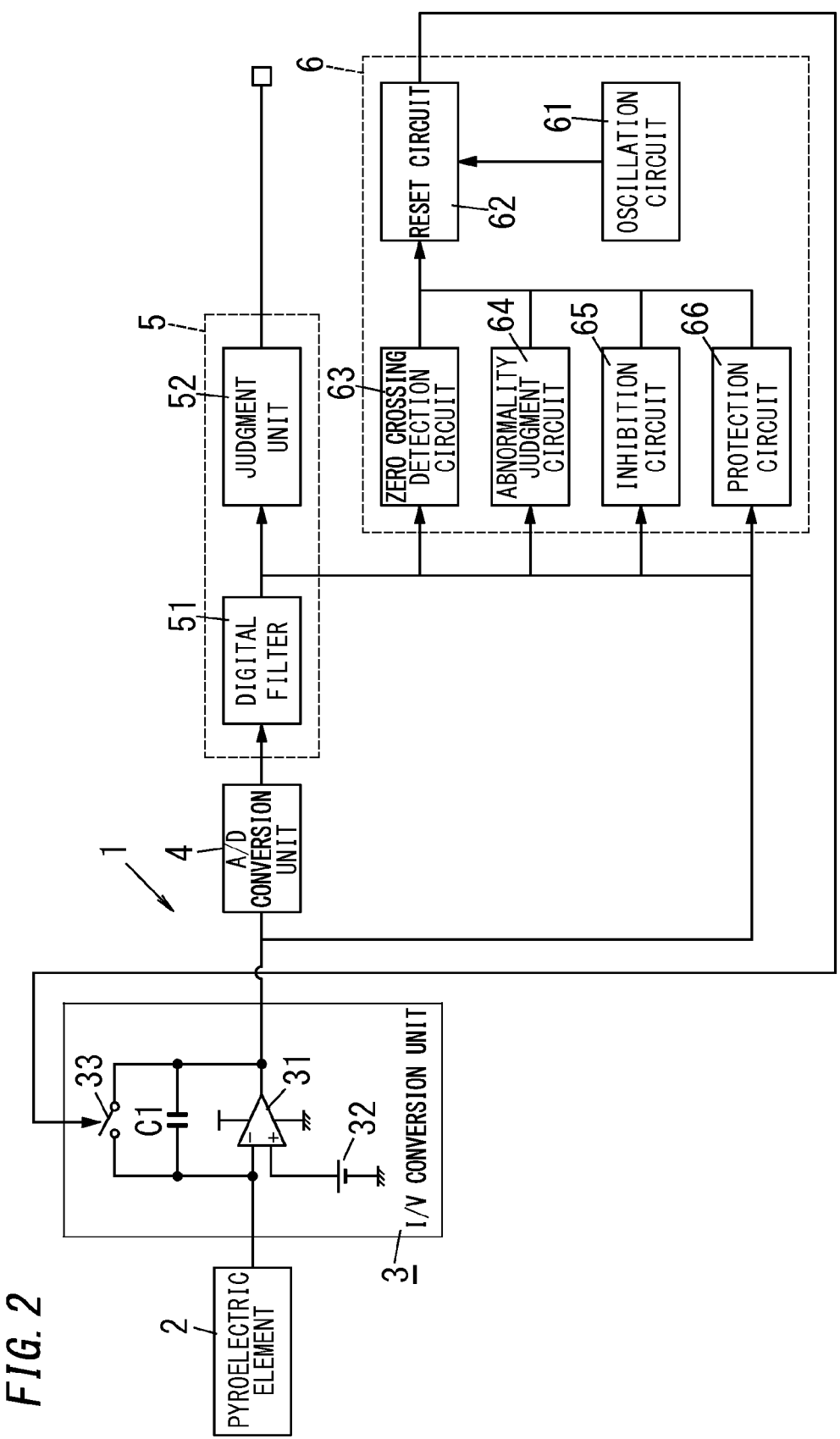
FIG. 2 is a schematic block diagram illustrating the configuration of the object detection device of the above first embodiment.

As shown in FIG. 2, the infrared detection device 1 of the present embodiment includes a pyroelectric element 2, an I/V conversion unit (I/V conversion circuit) 3, an A/D conversion unit (A/D conversion circuit) 4, a digital processing unit 5, and a control unit 6.

The pyroelectric element 2 is configured to output a current signal in response to a change in an amount of infrared light received from the target space.

The I/V conversion unit 3 is configured to convert the current signal from the pyroelectric element 2 to a voltage signal and output the voltage signal to the A/D conversion unit 4. The I/V conversion unit 3 includes an operational amplifier 31 connected to the pyroelectric element 2, a capacitive element (capacitor) C1 connected to the operational amplifier 31 to serve as a feedback circuit, and a discharging circuit (discharging unit) 33 for discharging the capacitor C1. The operational amplifier 31 has an inverting input terminal, a non-inverting input terminal, and an output terminal. The inverting input terminal of the operational amplifier 31 is connected to the pyroelectric element 2. The capacitor C1 is interposed between the inverting input terminal and the output terminal of the discharging circuit 33. The non-inverting input terminal of the operational amplifier 31 is connected to a reference power source 32. Therefore, the reference power source 32 applies a reference voltage to the non-inverting input terminal.

The discharging circuit 33 is a reset switch, for example. The discharging circuit 33 is configured to form a path for discharging the electric charges stored in the capacitive element C1 in response to receipt of a reset signal.

The A/D conversion unit 4 is configured to convert the voltage signal outputted from the I/V conversion unit 3 to a corresponding digital signal (first digital signal) and output the first digital signal to the digital processing unit 5. The A/D conversion unit 4 has an upper limit (Vth0, in the present embodiment) and a lower limit (−Vth0, in the present embodiment) of the magnitude of the voltage signal which the A/D conversion unit 4 can convert. In the present embodiment, the A/D conversion unit 4 is configured to convert the voltage signal to the first digital signal based on $\Delta\Sigma$ conversion.

The digital processing unit 5 includes a digital filter 51 and a judgment circuit 52.

The digital filter 51 is configured to extract a detection component having a frequency included in a frequency band (detection frequency band) associated with the object, from the first digital signal, by subjecting the first digital signal to an arithmetic processing, and create a digital signal (second digital signal) representing a waveform of the detection component, and output the second digital signal. In the present embodiment, the object is a human body. The detection frequency band is a range of 0.1 Hz to 10 Hz. Further, in the present embodiment, the digital filter 51 is configured to output a digital value indicative of the second digital signal in a serial method. The serial method is a BMC method.

The judgment circuit 52 is configured to judge, based on the second digital signal, whether or not the object exists in the target space. In the present embodiment, the judgment circuit 52 is configured to compare a magnitude of the wavelength represented by the second digital signal with a judgment value (first threshold) Vth1 (−Vth1), and to, upon determining that the magnitude of the wavelength represented by the second digital signal exceeds the judgment value Vth1 (−Vth1), conclude the object exists. The judgment circuit 52 is configured to output a detection signal having a high level, upon concluding that the object exists.

The control unit 6 is configured to control the discharging circuit 33 in such a manner to eliminate a low-frequency component from the voltage signal. The low-frequency component is defined as a component having a frequency not greater than a predetermined frequency. The predetermined frequency is defined as a frequency not greater than lower limit (0.1 Hz) of the detection frequency band. The control unit 6 is configured to control the discharging circuit 33 based on a period (reset period) corresponding to the predetermined frequency to discharge the electric charges stored in the capacitive element C1. In the present embodiment, the predetermined frequency is equivalent to the lower limit (=0.1 Hz). In brief, the low-frequency component having the frequency not higher than 0.1 Hz is eliminated. The reset period is 10 seconds which is corresponding to the predetermined period (=0.1 Hz).

In the present embodiment, the control unit 6 includes an oscillation circuit 61, a reset circuit 62, a zero crossing detection circuit 63, an abnormality judgment circuit 64, an inhibition circuit 65, and a protection circuit 66.

The oscillation circuit 61 is configured to create a pulse signal each time the reset period elapses and output the pulse signal to the reset circuit 62.

The zero crossing detection circuit 63 is configured to judge whether or not a magnitude of the waveform represented by the second digital signal is identical to a predetermined value. The zero crossing detection circuit 63 is configured to, upon determining the magnitude of the waveform represented by the second digital signal is identical to the predetermined value, output a zero crossing detection signal to the reset circuit 62. The predetermined value is defined as a value corresponding to a magnitude of the voltage signal obtained when electric charges are not stored in the capacitive element C1.

The abnormality judgment circuit 64 is configured to judge whether or not a magnitude of the waveform represented by the second digital signal continuously exceeds a predetermined threshold for a prescribed time period. The abnormality judgment circuit 64 is configured to, upon determining the magnitude of the waveform represented by the second digital signal continuously exceeds the predetermined threshold for the prescribed time period, output an abnormality signal (abnormality occurrence signal) to the reset circuit 62.

The inhibition circuit 65 is configured to judge whether or not the magnitude of the wavelength represented by the second digital signal exceeds an inhibition value less than the judgment value. The inhibition circuit 65 is configured to output an inhibition signal to the reset circuit 62 upon determining that the magnitude of the wavelength represented by the second digital signal exceeds the inhibition value. The inhibition circuit 65 is configured to output a cancel signal to the reset circuit 62 upon determining that the magnitude of the wavelength represented by the second digital signal does not exceed the inhibition value.

The protection circuit 66 is configured to judge whether or not the magnitude of the voltage signal exceeds a border value (Vth3) not greater than the upper limit (Vth0). The protection circuit 66 is configured to output an excess signal to the reset circuit 62 upon determining the magnitude of the voltage signal exceeds the border value.

The reset circuit 62 is configured to create a reset signal based on the pulse signal and output the reset signal to the discharging circuit 33.

In the present embodiment, the reset circuit 62 is configured to, in response to first receipt of the zero crossing detection signal subsequent to the receipt of the pulse signal, to output the reset signal to the discharging circuit 33. In addition, the reset circuit 62 is configured to, unless receiving the zero crossing detection signal before a lapse of predetermined time from the receipt of the pulse signal, output the reset signal to the discharging circuit 33 after a lapse of the predetermined time.

The reset circuit 62 is configured to output the reset signal to the discharging circuit 33 in response to receipt of the abnormality signal (abnormality occurrence signal). The reset circuit 62 is configured to output the reset signal to the discharging circuit 33 in response to receipt of the excess signal.

The reset circuit 62 is configured such that, once the reset circuit 62 receives the inhibition signal, the reset circuit 62 does not output the reset signal unless receiving the cancel signal.

The following is a detailed explanation of the present object detection device.

Figure 1:
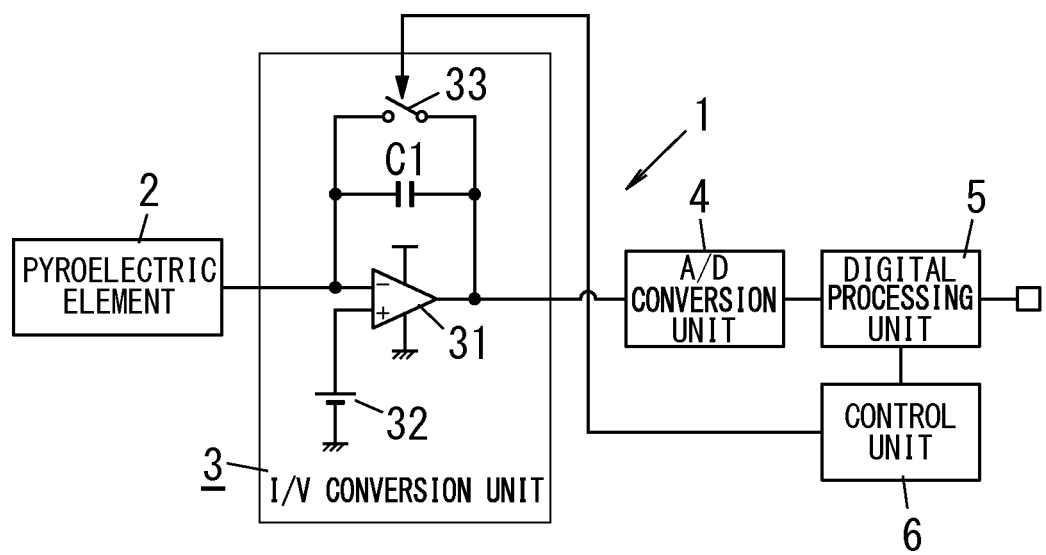
FIG. 1 is a schematic block diagram illustrating the configuration of the object detection device of the first embodiment.

As shown in FIG. 1, the infrared detection device 1 of the present embodiment includes the pyroelectric element 2, the I/V conversion unit 3, the A/D conversion unit 4, the digital processing unit 5, and the control unit 6. In the present embodiment, the infrared detection device 1 used for detecting a human body in a detection area is explained as one example of the present invention. The application of the infrared detection device 1 is not limited to human body detection, but the infrared detection device 1 may be used for the other application (e.g., gas detection), for example.

The pyroelectric element 2 receives infrared light from the detection area (target space), and outputs the current signal in response to a change in an amount of the received infrared light.

Figure 17:
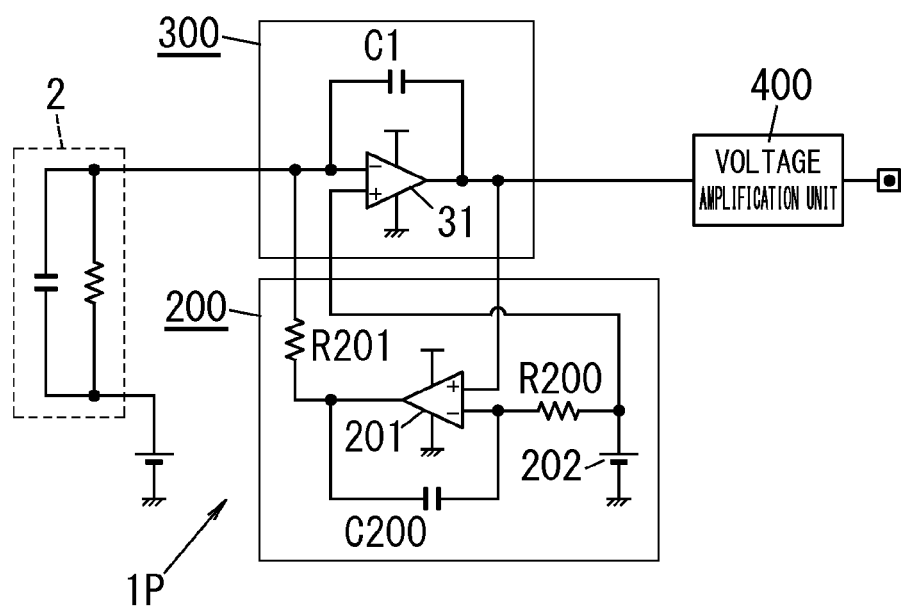
FIG. 17 is a schematic circuit diagram illustrating the configuration of the prior infrared detection device.

The I/V conversion unit 3 has a configuration similar to that of the I/V conversion unit 300 illustrated in FIG. 17, basically. The I/V conversion unit 3 includes the operational amplifier (first operational amplifier) 31. The first operational amplifier 31 has the inverting input terminal connected to the pyroelectric element 2. The capacitor C1 is interposed between the output terminal and the inverting input terminal of the operational amplifier 31. The capacitor C1 serves as a capacitive element for forming an AC feedback circuit. The reference power source 32 producing the reference voltage is connected to the non-inverting input terminal of the operational amplifier 31.

According to the I/V conversion unit 3 which is constructed in the above manner and performs conversion using a capacitive circuit, the current signal (weak current signal) from the pyroelectric element 2 is converted to the voltage signal by use of the impedance of the capacitor C1. Therefore, the voltage (voltage of the output terminal of the operational amplifier 31) outputted from the operational amplifier 31 is identical to a value obtained by subtracting a voltage across the capacitor C1 from the reference voltage generated by the reference power source 32. In other words, an output of the I/V conversion unit 3 has an operating point defined by the reference voltage, and varies from the operating point in response to a change in the current signal caused by receipt of infrared light at the pyroelectric element 2.

As to the following explanation, in order to simplify the explanation, the output of the I/V conversion unit 3 at the operating point (reference voltage) is deemed zero. According to this definition, the output of the I/V conversion unit 3 represents an amount of a change from the operating point of a voltage outputted from the operational amplifier 31.

The reset switch 33 is interposed between the output terminal and the inverting input terminal of the operational amplifier 31 and is connected in parallel with the capacitor C1. The reset switch 33 is turned on and off in accordance with the reset signal from the control unit 6. When the reset switch 33 is turned on, the reset switch 33 serves as the discharging unit (discharging circuit) used for forming a discharging path for discharging the electric charges stored in the capacitor C1. In brief, when the reset switch 33 is turned on, the voltage across the capacitor C1 is reset to zero, and the output (output value) of the I/V conversion unit 3 is reset to zero (operating point).

The A/D conversion unit 4 is configured to convert the output value of the I/V conversion unit 3 to a corresponding digital value. Specifically, the A/D conversion unit 4 converts a voltage value (analog value) received from the I/V conversion unit 3 to a corresponding digital value and outputs the digital value to the digital processing unit 5. In other words, the A/D conversion unit 4 converts an instantaneous value of the analog signal to a digital serial bit sequence and outputs the digital serial bit sequence. The A/D conversion unit 4 has an acceptable range (−Vth0 to Vht0, in this embodiment) indicative of a range of an analog value which the A/D conversion unit 4 can convert to a digital value. The acceptable range is preliminarily determined based on a reference voltage applied from an outside circuit. When the A/D conversion unit 4 receives an analog signal having an amplitude not included in the allowable range, an output of the A/D conversion unit 4 is saturated.

The digital processing unit 5 judges whether or not a human body exits in the detection area, based on the digital signal received from the A/D conversion unit 4. In more detail, the digital processing unit 5 includes the judgment unit (judgment circuit) 52 configured to judge whether or not a human body exists in the detection area, by means of comparing the output value of the A/D conversion unit 4 (corresponding to the output of the I/V conversion unit 3) with a predetermined first threshold. When an absolute value of the output value of the A/D conversion unit 4 exceeds the first threshold, the judgment unit 52 determines the human body exists in the detection area, and outputs the detection signal having a high level. When the absolute value of the output value of the A/D conversion unit 4 falls below the first threshold, the judgment unit 52 determines no human body exists in the detection area, and outputs the detection signal having a low level.

The digital processing unit 5 (digital filter 51) is configured to allow a signal component having a frequency in a predetermined frequency band of the output of the A/D conversion unit 4 to pass through. In the present embodiment, the digital processing unit 5 serves as a digital bandpass filter (hereinafter referred to as "BPF") having a passing band defined by a frequency range (0.1 Hz to 10 Hz, in the present embodiment) of the current signal which is generated by the pyroelectric element 2 in response to human body detection.

Similar to the prior infrared detection device 1P as illustrated in FIG. 17, when an analog BPF is used, an element such as a capacitor having a relatively high circuit constant is necessary to allow a signal in a range of 0.1 Hz to 10 Hz to pass through. Such an element is connected to an IC (integrated circuit) externally. With this configuration, it is impossible to provide a circuit part of the infrared detection device 1 as a one-chip circuit. In contrast, the infrared detection device 1 of the present embodiment employs the digital BPF as mentioned in the above. Therefore, an external part can be unnecessary and the circuit part can be provided as a one-chip circuit.

According to the infrared detection device 1 having the aforementioned configuration, the current signal outputted from the pyroelectric element 2 is converted to the voltage signal by the I/V conversion unit 3, and subsequently is converted to the digital value by the A/D conversion unit 4, and finally is inputted into the digital processing unit 5. The digital processing unit 5 judges whether or not the human body exists in the detection area based on the inputted digital value. The digital processing unit 5 outputs a judgment result to a microcomputer (not shown) connected to an output side of the digital processing unit 5, for example.

In the infrared detection device 1 of the present embodiment, the control unit 6 resets the capacitor C1 by turning on the reset switch 33 at an appropriate timing, thereby eliminating an undesired low-frequency component (hereinafter referred to as "undesired component") having a frequency not less than a predetermined frequency from the output of the I/V conversion unit 3. For example, the undesired component is a fluctuation component which occurs in the current signal outputted from the pyroelectric element 2 due to changes (e.g., a change in an environmental temperature) irrespective of the detection target (human body).

In brief, the control unit 6 outputs the reset signal at such a timing that the undesired component is eliminated from the output of the I/V conversion unit 3, and turns on the reset switch 33 to reset the voltage across the capacitor C1. In more detail, the control unit 6 includes an oscillator (not shown) designed to output a clock signal each time a predetermined period elapses. The predetermined period is selected such that the undesired component is removed. The control unit 6 creates the reset signal based on the clock signal.

The period for determining the timing of generating the clock signal is determined based on a frequency corresponding to an upper limit of the undesired component. As an example, in consideration of the frequency band (0.1 Hz to 10 Hz) of the current signal which is generated by the pyroelectric element 2 in response to the human detection, the low-frequency component with a frequency not less than 0.1 Hz is assumed to be the undesired component.

In brief, when the frequency defining the upper limit of the undesired component is 0.1 Hz, the time of 10 seconds corresponding to this frequency is adopted as the period for determining the timing of generating the clock signal. When the control unit 6 resets the voltage across the capacitor C1 each time the period selected in the aforementioned manner elapses, the undesired component is eliminated from the output of the I/V conversion unit 3. In other words, the control unit 6 and the I/V conversion unit 3 constitute a high-pass filter having a cut-off frequency equivalent to the frequency defining the upper limit of the undesired component.

Further, in the present embodiment, the output of the digital processing unit 5 is inputted into the control unit 6 as a feedback signal. As mentioned in the above, the digital processing unit 5 has a function of the digital BPF (filter unit) having the passing band of 0.1 Hz to 10 Hz. Therefore, the feedback signal is defined as a signal obtained by removing the undesired component from the output of the I/V conversion unit 3.

The infrared detection device 1 includes the filter unit (digital filter) 51 configured to allow, to pass through, a signal component which has a frequency included in a predetermined frequency band of the output of the I/V conversion unit 3. The control unit 6 receives the output of the filter unit as the feedback signal. When the feedback signal shows the first zero crossing after the generation of the clock signal, the control unit 6 creates the reset signal to reset the voltage across the capacitive element C1.

Figure 3:
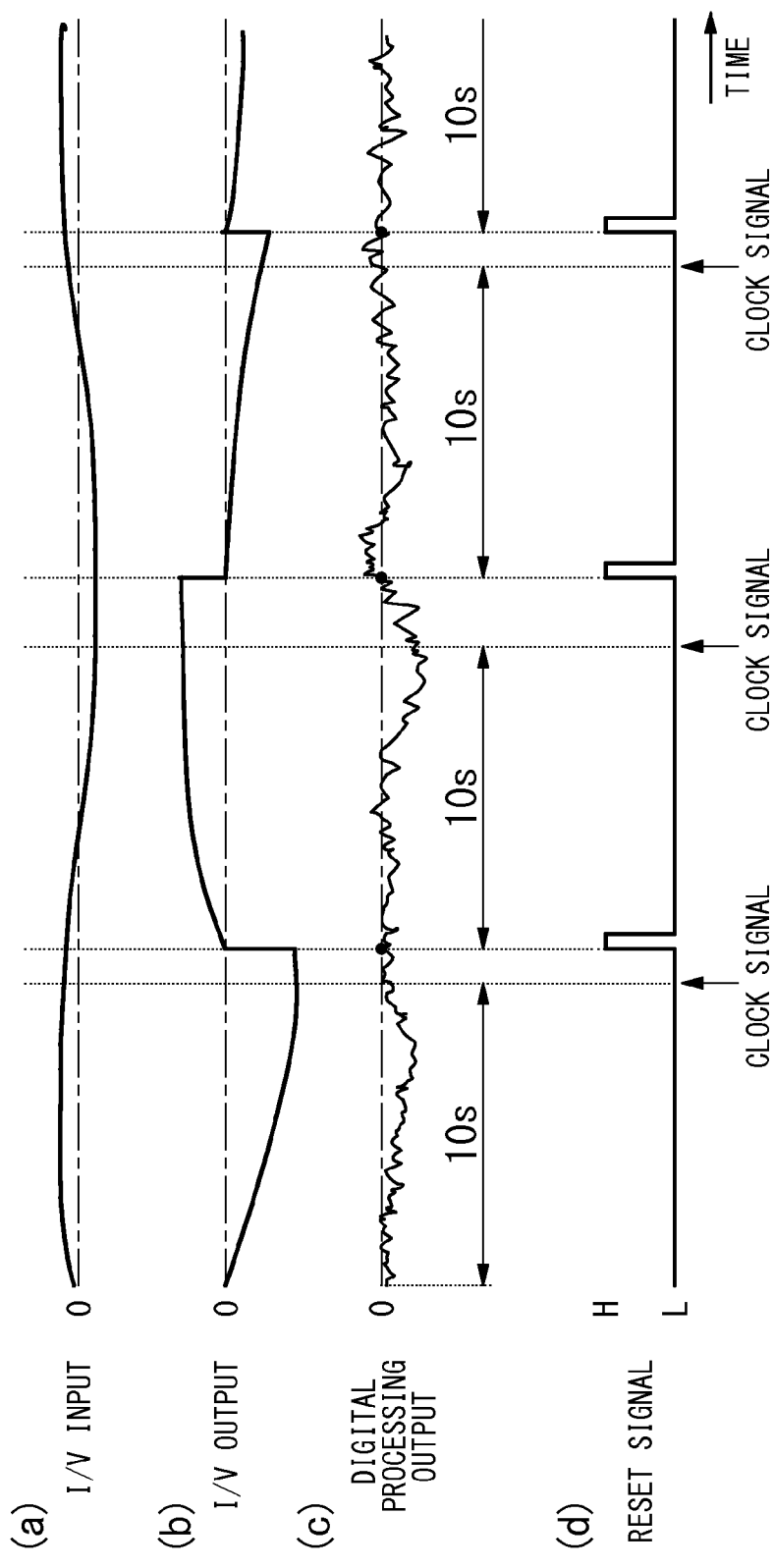
FIG. 3 is a time chart illustrating the operation of the object detection device of the first embodiment.

In the present embodiment, as shown in FIG. 3, after the generation of the clock signal which is created each time the period of 10 seconds elapses, the control unit 6 outputs the reset signal at the first zero crossing of the feedback signal to turn on the reset switch 33 so as to reset the voltage across the capacitor C1. In this operation, the zero crossing of the feedback signal means the time at which the output of the digital processing unit 5 becomes identical to zero (operating point). In FIG. 3, (a) shows the current signal inputted into the I/V conversion unit 3, and (b) shows the voltage signal outputted from the I/V conversion unit 3, and (c) shows the output (feedback signal) of the digital processing unit 5, and (d) shows the reset signal. The output value of the digital processing unit 5 is actually a digital value. However, with regard to FIG. 3 (c) and the other figures explained below, the output value of the digital processing unit 5 is shown as an analog value.

For example, as shown in FIG. 3, the current signal including only the undesired component which has the frequency equal to or less than 0.1 Hz is inputted into the I/V conversion unit 3. In this situation, as shown in FIG. 3 (c), the digital processing unit 5 outputs the feedback signal devoid of the undesired component to the control unit 6. The feedback signal may include a noise component. Therefore, the feedback signal shows a fluctuation as shown in FIG. 3 (c). The noise component included in the feedback signal mainly contains a circuit noise which occurs in the I/V conversion unit 3 prior to the A/D conversion, and a noise which occurs in the digital processing unit 5 subsequent to the A/D conversion, for example. After the generation of the clock signal which is created each time the period of 10 seconds elapses, the control unit 6 outputs the reset signal at the zero crossing of the feedback signal (i.e., at the time at which the noise component becomes zero) to reset the voltage across the capacitor C1.

Consequently, when the output of the digital processing unit 5 becomes zero, the control unit 6 resets the capacitor C1. Therefore, it is possible to suppress a fluctuation which would otherwise occur in the output of the digital processing unit 5 due to a voltage difference at the time of reset.

As shown in FIG. 4, when the zero crossing does not occur in the feedback signal even when a predetermined extension period elapses from the timing of the generation of the clock signal, the control unit 6 turns on the discharging circuit 33 to reset the capacitor C1 at the timing of a lapse of the extension period. In FIG. 4, (a) shows the output (feedback signal) of the digital processing unit 5, and (b) shows the reset signal. In brief, when the zero crossing is not observed in the feedback signal even when the predetermined extension period elapses from the timing of the generation of the clock signal, the control circuit 6 creates the reset signal to reset the capacitor C1 at the timing of a lapse of the extension period.

The extension period is shorter than the period defining the interval between the clock signals generated by the oscillator. For example, when the period is 10 seconds, the extension period is selected to be 3 seconds. Alternatively, the extension period may be greater than the period defining the interval between the clock signals. For example, the extension period may be 20 seconds.

According to the above configuration, even in a situation where the infrared detection device 1 has some troubles and thus the output of the digital processing unit 5 does not become zero even when the extension period elapses from the timing of generation of the clock signal, the capacitor C1 is reset and therefore the undesired component is eliminated.

Moreover, in another modification of the present embodiment, as shown in FIG. 5, the control unit 6 may be configured to output the reset signal at the timing at which the oscillator outputs the clock signal, so as to reset the capacitor C1. In FIG. 5, (a) shows the output (feedback signal) of the digital processing unit 5, and (b) shows the reset signal. In this modification, it is sufficient that the control unit 6 outputs the clock signal irrespective of the output of the digital processing unit 5. Therefore, the feedback signal from the digital processing unit 5 to the control unit 6 is unnecessary, and it is possible to simplify the circuit configuration.

In addition, the control unit 6 includes an abnormality protection unit. The abnormality protection unit outputs the reset signal to reset the capacitor C1 when the absolute value of the output value of the I/V conversion unit 3 continuously exceeds a first threshold for a predetermined allowable period. In other words, in this infrared detection device 1, the control unit 6 includes the abnormality protection unit (abnormality judgment circuit 64 and the reset circuit 62). When the absolute value of the output value of the I/V conversion unit 3 continuously exceeds the predetermined threshold for the predetermined allowable period, the abnormality protection unit (abnormality judgment circuit 64 and the reset circuit 62) resets the capacitive element C1.

Figure 6:
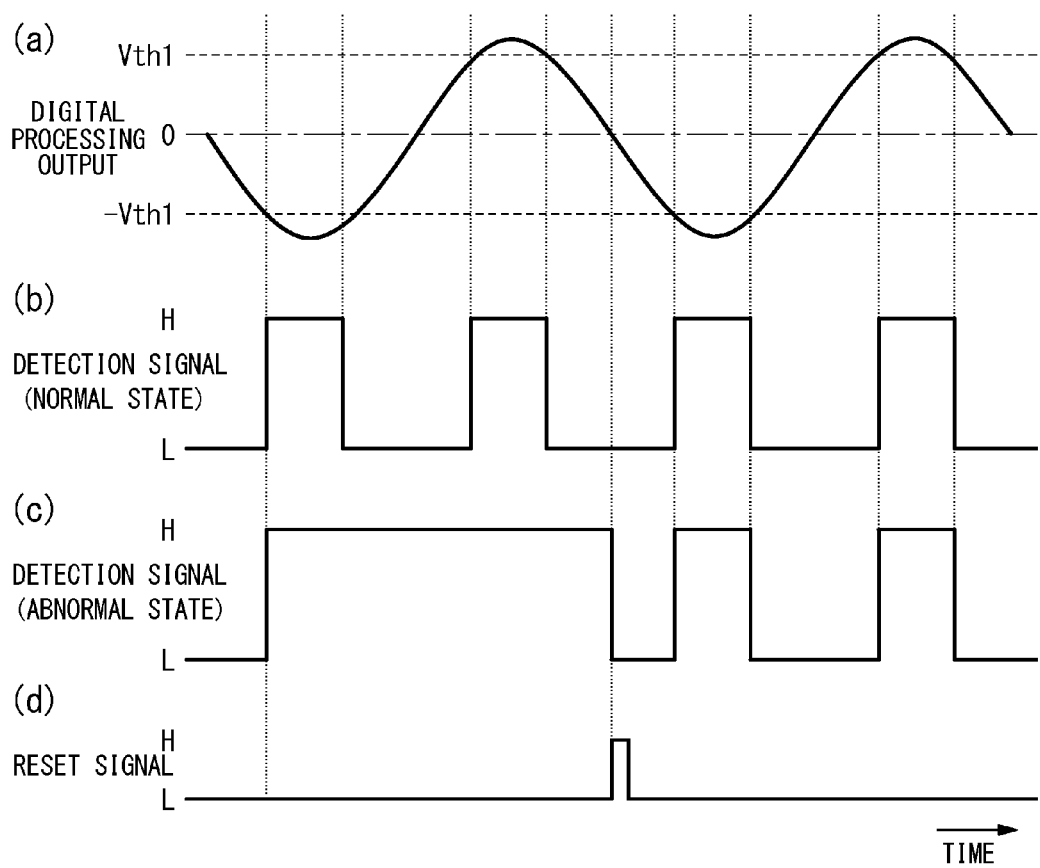
FIG. 6 is a time chart illustrating the operation of the object detection device of the first embodiment.

In brief, when the infrared detection device 1 operates normally, the absolute value of the output value of the digital processing unit 5 exceeds the first threshold Vth1 periodically while the human body is detected, as shown in FIG. 6 (*a*). Consequently, as shown in FIG. 6 (*b*), the detection signal has the high level and the low level alternately. In contrast, when the infrared detection device 1 operates abnormally, the detection signal is likely to keep having the high level, as shown in FIG. 6 (*c*). In view of this, when the state where the detection signal has the high level continues for the allowable period as shown in FIG. 6 (*c*), the control unit 6 outputs the reset signal to reset the capacitor C1 as shown in FIG. 6 (*d*).

According to this configuration, when the abnormality that the detection signal has the high level over the allowable period occurs in the operation of the infrared detection device 1, the control 6 identifies the abnormality and resets the capacitor C1. After such reset, the human body detection can be performed successfully.

In addition, the control unit 6 includes an A/D conversion protection unit. When the absolute value of an input of the A/D conversion unit 4 exceeds a third threshold falling within the acceptable range of the input which the A/D conversion unit 4 can convert to a corresponding digital value, the A/D conversion protection unit outputs the reset signal to reset the capacitor C1. In other words, the control unit 6 includes the A/D conversion protection unit (the protection circuit 66 and the reset circuit 62). When the absolute value of the input of the A/D conversion unit 4 exceeds the third threshold Vth3 which is selected to be not greater than the upper limit Vth0 of the acceptable range of the input which the A/D conversion unit 4 can convert to a corresponding digital value, the A/D conversion protection unit resets the capacitive element C1.

Figure 7:
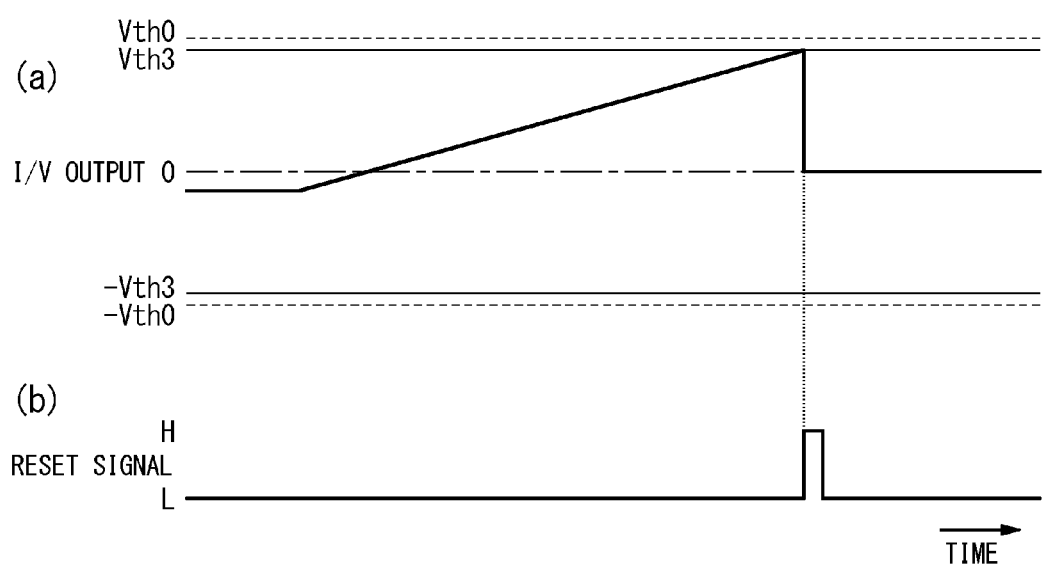
FIG. 7 is a time chart illustrating the operation of the object detection device of the first embodiment.

Especially, as shown in FIG. 7, the third threshold Vth3 serving as an upper third threshold is slightly less than the upper limit Vth0 of the acceptable range, and the third threshold –Vth3 serving as a lower third threshold is slightly greater than the lower limit –Vth0 of the acceptable range. In FIG. 7, (a) shows the output value of the I/V conversion unit 3 and (b) shows the reset signal. The control unit 6 monitors the output value of the I/V conversion unit 3 (the input value of the A/D conversion unit 4). When the output value of the I/V conversion unit 3 reaches the third threshold Vth3 (or –Vth3), the control unit 6 determines the output value of the I/V conversion unit 3 exceeds the third threshold Vth3 (or –Vth3), and outputs the reset signal to reset the capacitor C1.

According to this configuration, when the input of the A/D conversion unit 4 comes near to go beyond the acceptable range, the control unit 6 resets the capacitor C1 so as to reset the output value of the I/V conversion unit 3 serving as the input of the A/D conversion unit 4 to zero (operating point). Therefore, the input of the A/D conversion unit 4 is kept falling within the acceptable range, and thus the saturation of the output of the A/D conversion unit 4 is avoided. Consequently, the infrared detection device 1 can be successfully kept in a state capable of detecting a human body. The third threshold Vth3 may be equal to the upper limit Vth0 of the acceptable range, and the third threshold –Vth3 may be equal to the lower limit –Vth0 of the acceptable range.

The infrared detection device 1 includes the judgment unit 52. The judgment circuit 52 compares the absolute value of the value corresponding to the output value of the I/V conversion unit with the first threshold (judgment value). The judgment circuit 52 determines the presence or absence of the detection target based on whether or not the absolute value exceeds the first threshold. When the absolute value is less than the second threshold (prohibition value) less than the first threshold, the control unit 6 operates at a first operation mode in which the control unit 6 is permitted to reset the capacitive element. When the absolute value exceeds the second threshold, the control unit 6 operates at a second operation mode in which the control unit 6 is not permitted to reset the capacitive element.

In brief, while the absolute value of the output value of the I/V conversion unit 3 is less than the second threshold which is less than the first threshold for the human body detection, the control unit 6 operates at the first operation mode. While the absolute value of the output value of the I/V conversion unit 3 exceeds the second threshold, the control unit 6 operates at the second operation mode. In the first operation mode, the control unit 6 is allowed to output the reset signal. In contrast, in the second operation mode, the control unit 6 is not allowed to output the reset signal.

Figure 8:
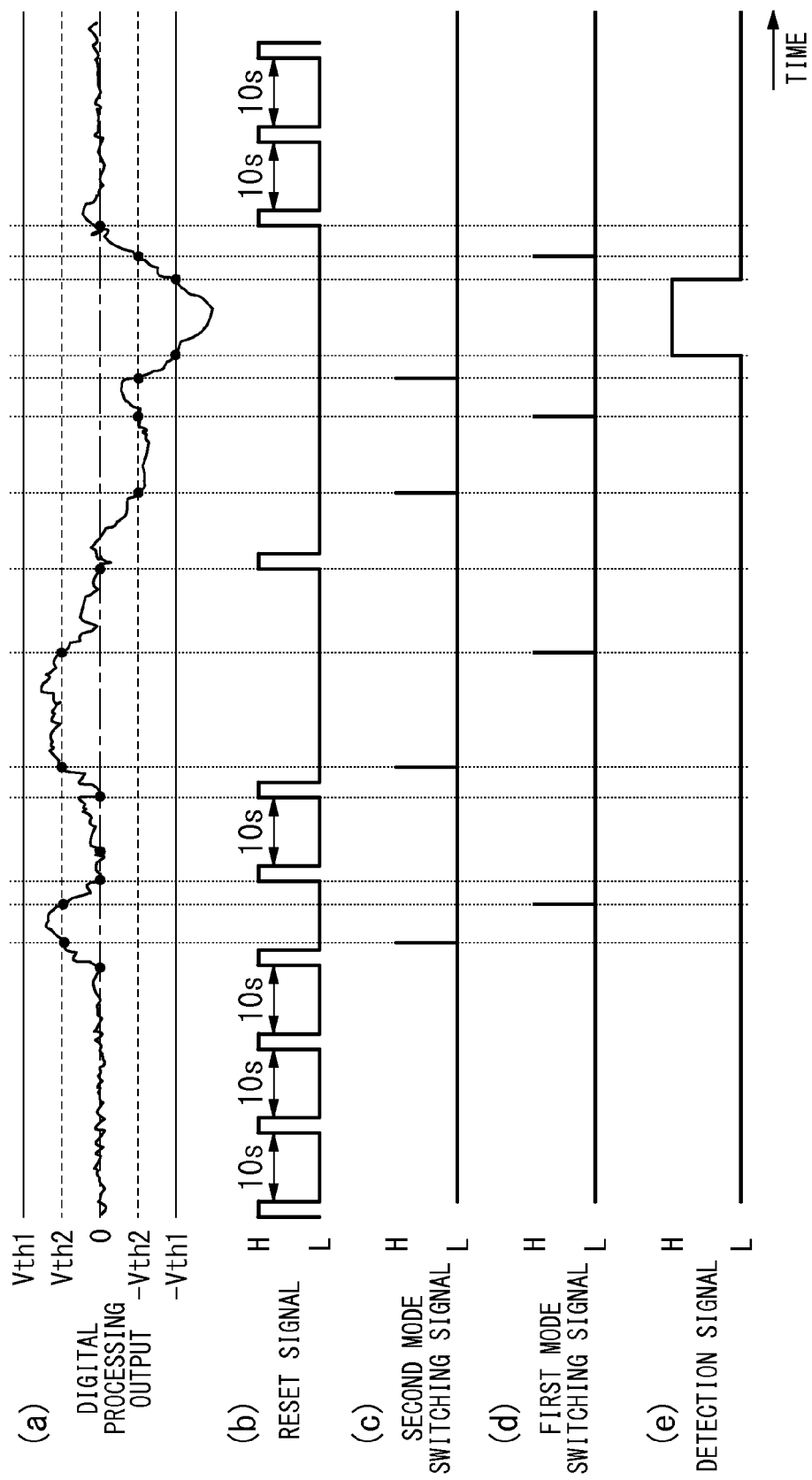
FIG. 8 is a time chart illustrating the operation of the object detection device of the first embodiment.

In more detail, the control unit 6 compares the output (feedback signal) of the digital processing unit 5 corresponding to the output value of the I/V conversion unit 3 with the second thresholds –Vth2 and Vth2, as shown in FIG. 8 (*a*). When the output of the digital processing unit 5 goes beyond the range (–Vth2 to Vth2) defined by the second thresholds –Vth2 and Vth2, the control unit 6 outputs a second mode switching signal for switch from the first operation mode to the second operation mode, as shown in FIG. 8 (*c*). When the output of the digital processing unit 5 falls within the range (–Vth2 to Vth2) defined by the second thresholds –Vth2 and Vth2, the control unit 6 outputs a first mode switching signal for switch from the second operation mode to the first operation mode, as shown in FIG. 8 (*d*).

With regard to FIG. 8, (a) shows the output of the digital processing unit 5 (the feedback signal), and (b) shows the reset signal, and (c) shows the second mode switching signal, and (d) shows the first mode switching signal, and (e) shows the detection signal.

In the first operation mode, as mentioned in the above, after the generation of the clock signal generated with the period of 10 seconds, the control unit 6 outputs the reset signal at the first zero crossing of the feedback signal to turn on the reset switch 33 so as to reset the capacitor C1. In contrast, in the second operation mode, the control unit 6 terminates the generation of the clock signal, and stops the operation for resetting the capacitor C1. When the switch from the second operation mode to the first operation mode is made in response to the first mode switching signal, the control unit 6 outputs the reset signal at the first zero crossing of the feedback signal after the switch of the operation mode. Thus, the control unit 6 turns on the reset switch 33 to reset the capacitor C1.

According to this configuration, in the infrared detection device 1, while the absolute value of the output value of the I/V conversion unit 3 exceeds the second threshold, the capacitor C1 is not reset. The output value of the I/V conversion unit 3 is not reset to zero (operating point) before completion of the operation of the human body detection. Therefore, it is possible to prevent delay of the detection signal and failure of the output of the detection signal which would otherwise be caused by the reset of the output value of the I/V conversion unit 3 prior to the completion of the operation of the human body detection. Consequently, the sensitivity of the human body detection can be enhanced.

As mentioned in the above, the object detection device 1 of the present embodiment is an object detection device for detecting the object in the target space. The object detection device 1 of the present embodiment includes the pyroelectric element 2, the I/V conversion circuit (I/V conversion unit) 3, the A/D conversion circuit (A/D conversion unit) 4, the digital filter 51, the judgment circuit 52, and the control unit 6. The pyroelectric element 2 is configured to output the current signal in response to the change in the amount of infrared light received from the target space. The I/V conversion circuit 3 includes the operational amplifier 31 connected to the pyroelectric element 2, the capacitive element C1 connected to the operational amplifier 31 to serve as the feedback circuit, and the discharging circuit 33 for discharging the capacitive element C1. The I/V conversion circuit 3 is configured to convert the current signal to the voltage signal and output the voltage signal. The A/D conversion circuit 4 is configured to convert the voltage signal to the first digital signal and output the first digital signal. The digital filter 51 is configured to extract the detection component having the frequency included in the frequency band (detection frequency band) associated with the object, from the waveform represented by the first digital signal, by subjecting the first digital signal to the arithmetic processing, and create the second digital signal representing the waveform of the detection component, and output the second digital signal. The judgment circuit 52 is configured to judge, based on the second digital signal, whether or not the object exists in the target space. The control unit 6 is configured to control the discharging circuit 33 in such a manner to eliminate the low-frequency component from the voltage signal. The low-frequency component is defined as a component having a frequency not greater than the predetermined frequency. The predetermined frequency is not greater than the lower limit of the frequency band (detection frequency band). The control unit 6 is configured to control the discharging circuit 33 based on the period (reset period) corresponding to the predetermined frequency to discharge the electric charges stored in the capacitive element C1.

Further, in the object detection device 1 of the present embodiment, the control unit 6 includes the oscillation circuit 61 and the reset circuit 62. The oscillation circuit 61 is configured to create the pulse signal each time the reset period elapses (create the pulse signal with the reset period) and output the pulse signal to the reset circuit 62. The reset circuit 62 is configured to create the reset signal based on the pulse signal and output the reset signal to the discharging circuit 33. The discharging circuit 33 is configured to form the path for discharging the electric charges stored in the capacitive element C1 in response to receipt of the reset signal.

Further, in the object detection device 1 of the present embodiment, the control unit 6 includes the zero crossing detection circuit 63. The zero crossing detection circuit 63 is configured to judge whether or not the magnitude of the waveform represented by the second digital signal is identical to the predetermined value, and to, upon determining the magnitude of the waveform represented by the second digital signal is identical to the predetermined value, output the zero crossing detection signal to the reset circuit 62. The reset circuit 62 is configured to, in response to first receipt of the zero crossing detection signal subsequent to the receipt of the pulse signal, to output the reset signal to the discharging circuit 33. The predetermined value is defined as a value corresponding to a magnitude of the voltage signal obtained when electric charges are not stored in the capacitive element C1.

Further, in the object detection device 1 of the present embodiment, the reset circuit 62 is configured to, unless receiving the zero crossing detection signal before a lapse of predetermined time (extension period) from the receipt of the pulse signal, output the reset signal to the discharging circuit 33 after a lapse of the predetermined time.

Further, in the object detection device 1 of the present embodiment, the control unit 6 includes the abnormality judgment circuit 64. The abnormality judgment circuit 64 is configured to judge whether or not the magnitude of the waveform represented by the second digital signal continuously exceeds the predetermined threshold (first threshold Vth1) for the prescribed time period (allowable period), and to, upon determining the magnitude of the waveform represented by the second digital signal continuously exceeds the predetermined threshold for the prescribed time period, output the abnormality signal to the reset circuit 62. The reset circuit 62 is configured to output the reset signal to the discharging circuit 33 in response to receipt of the abnormality signal.

Further, in the object detection device 1 of the present embodiment, the judgment circuit 52 is configured to compare the magnitude of the wavelength represented by the second digital signal with the judgment value (first threshold Vth1), and to, upon determining that the magnitude of the wavelength represented by the second digital signal exceeds the judgment value, conclude the object (human body, in the present embodiment) exists. The control unit 6 includes the inhibition circuit 65. The inhibition circuit 65 is configured to judge whether or not the magnitude of the wavelength represented by the second digital signal exceeds the inhibition value (second threshold Vth2) less than the judgment value (first threshold Vth1), and to output the inhibition signal to the reset circuit 62 upon determining that the magnitude of the wavelength represented by the second digital signal exceeds the inhibition value, and to output the cancel signal to the reset circuit 62 upon determining that the magnitude of the wavelength represented by the second digital signal does not exceed the inhibition value. The reset circuit 62 is configured such that, once the reset circuit 62 receives the inhibition signal, the reset circuit 62 does not output the reset signal unless receiving the cancel signal.

Further, in the object detection device 1 of the present embodiment, the A/D conversion circuit 4 has the upper limit Vth0 of the magnitude of the voltage signal which the A/D conversion circuit 4 can convert. The control unit 6 includes the protection circuit 66. The protection circuit 66 is configured to judge whether or not the magnitude of the voltage signal exceeds the border value (third threshold) Vth3 not greater than the upper limit Vth0, and to output the excess signal to the reset circuit 62 upon determining the magnitude of the voltage signal exceeds the border value Vth3. The reset circuit 62 is configured to output the reset signal to the discharging circuit 33 in response to receipt of the excess signal.

In other words, the infrared detection device 1 of the present embodiment includes the pyroelectric element 2 and the I/V conversion unit 3. The I/V conversion unit 3 is configured to convert the current signal to the voltage signal by use of the operational amplifier 31 connected with the capacitive element C1 for feedback. The I/V conversion unit 3 is provided with the discharging unit 33 configured to create the discharging path for discharging the electric charges stored in the capacitive element C1. The infrared detection device 1 is provided with the control unit 6 configured to control the discharging unit 33 to reset the capacitive element C1 at such a timing that the low-frequency component having the frequency not greater than the predetermined frequency is eliminated from the output of the I/V conversion unit 3.

In addition, the control unit 6 includes the oscillation circuit 61 designed to generate the clock signal with such a predetermined period that the low-frequency component is removed. The control unit 6 is configured to create the reset signal in response to the clock signal and use the reset signal in order to reset the capacitive element C1.

According to the infrared detection device 1 with the configuration explained in the above, the control unit 6 controls the reset switch 33 serving as the discharging unit so as to reset the voltage across the capacitor C1. Therefore, it is possible to eliminate the undesired component from the output of the I/V conversion unit 3. In brief, a change in an environment temperature is likely to cause an undesired low-frequency component which has no relation to a detection target (e.g., a human body) in the output current outputted from the pyroelectric element 2, for example. In contrast, the infrared detection device 1 employing the above configuration can eliminate such undesired low-frequency components as undesired components. Consequently, it is possible to avoid occurrence of erroneous detection which would otherwise occur due to such undesired components, for example.

Moreover, in the infrared detection device 1, only the pyroelectric element 2 is connected to the input terminal of the I/V conversion unit 3. Therefore, in contrast to a situation where the input resistor is connected to the input terminal of the I/V conversion unit 3 as explained in the above background art, the S/N ratio of the I/V conversion unit 3 can be improved. In brief, with regard to the situation where the input resistor is connected to the input terminal of the I/V conversion unit 3, when a noise component occurs in the input resistor, such a noise component also is inputted into the I/V conversion unit 3. This causes a decrease in the S/N ratio of the I/V conversion unit 3. Especially, in order to downsize the infrared detection device 1, normally, a resistive element incorporated in an IC (integrated circuit) serves as the input resistor. The resistance of such a resistive element greatly depends on the temperature. Therefore, a variation in the resistance caused by a change in the temperature is increased with an increase in the resistance of such a resistive element. A decrease in the resistance of the input resistor may cause an increase in a thermal noise of the input resistor. Thus, the S/N ratio of the I/V conversion unit 3 may be decreased.

In contrast, according to the infrared detection device 1 with the above configuration, to eliminate the undesired component, the control unit 6 controls the timing at which the capacitor C1 of the I/V conversion unit 3 is reset. Therefore, the DC feedback circuit including the input resistor is unnecessary. Consequently, it is possible to eliminate an effect of a noise caused by the DC feedback circuit including the input resistor, and the S/N ratio of the I/V conversion unit 3 can be improved.

Accordingly, the infrared detection device 1 of the present embodiment can suppress an effect of the undesired low-frequency component on the output of the I/V conversion unit 3 yet the infrared detection device 1 can improve the S/N ratio of the I/V conversion unit 3.

Additionally, in contrast to a situation where the DC feedback circuit is interposed between the output terminal and the input terminal of the I/V conversion unit 3 as explained in the background art, the infrared detection device 1 of the present embodiment does not need the DC feedback circuit. Therefore, the circuit of the infrared detection device 1 of the present embodiment can be downsized.

In the present embodiment, the A/D conversion unit 4 is a $\Delta\Sigma$ (delta-sigma) A/D convertor. In other words, the A/D conversion unit 4 performs a $\Delta\Sigma$ conversion process. Therefore, it is possible to downsize the A/D conversion unit 4 and improve the accuracy of the A/D conversion unit 4.

Figure 9:
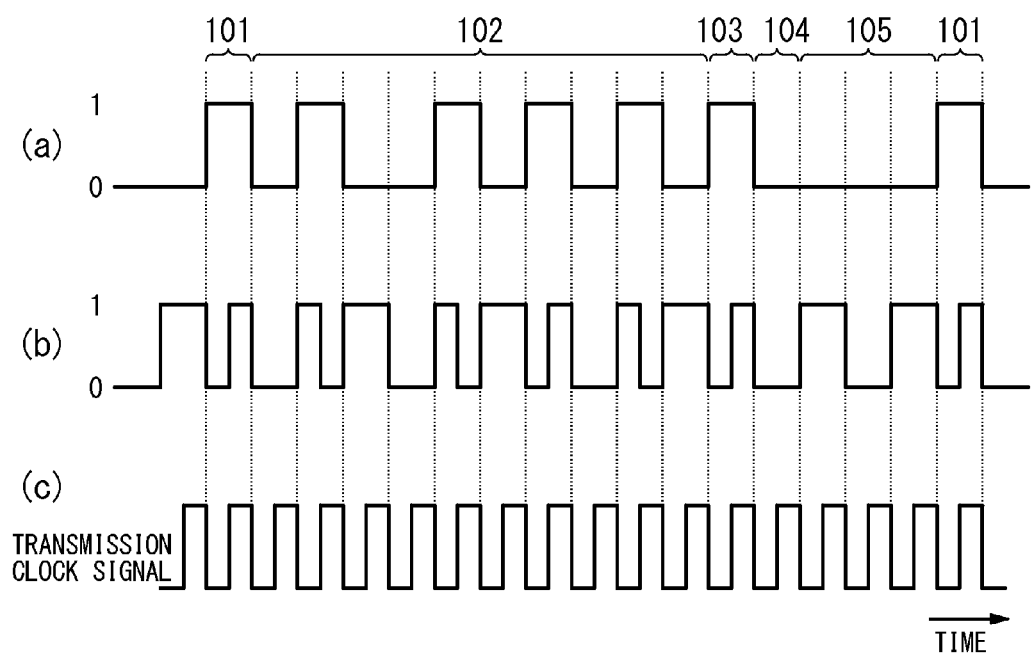
FIG. 9 is an explanatory diagram illustrating the output format of the digital processing unit of the object detection device of the above first embodiment.

The digital processing unit 5 outputs the digital signal in a serial manner. Especially, as shown in FIG. 9 (*a*), the digital processing unit 5 uses a signal format including a start bit 101, a main filter output 102, a detection signal state 103, an operation mode judgment result 104, and a stop bit 105. The main filter output 102 indicates an instantaneous value of a signal which is obtained by eliminating the undesired component from the output of the I/V conversion unit 3 by means of passing the output of the I/V conversion unit 3 through the digital BPF, in a similar manner as the feedback signal. The detection signal state 103 indicates a state (high level or low level) of the detection signal. The operation mode judgment result 104 indicates the operation mode.

The digital processing unit 5 outputs the digital signal with 16 bits (the main filter output 102 has 10 bits, and the stop bit 105 has 3 bits, and the others have 1 bit) in synchronization with a transmission clock signal (e.g., 1 MHz) shown in FIG. 9 (*c*) through one serial communication process. Since the digital processing unit 5 superimposes various data on the transmission clock signal, the digital processing unit 5 can send the various data via one signal line. Therefore, it is possible to reduce the number of terminals of the digital processing unit 5 and to downsize the infrared detection device 1.

The digital processing unit 5 employs a BMC encoding method as the serial manner. In the BMC encoding method, the output level is inverted for each cell. In brief, the digital processing unit 5 converts the output by use of the BMC (Biphase Mark Code) encoding method in which the output level is inverted for each cell. For example, as shown in FIG. 9 (*b*), the digital processing unit 5 encodes data of "1" to "01" or "10" based on the BMC encoding method, and encodes data of "0" to "00" or "11" based on the BMC encoding method. Further, the digital processing unit 5 inverts the output level for each cell. Besides, the cell means a time slot used for transmitting pre-encoded data corresponding to one bit.

As mentioned in the above, the digital processing unit 5 performs the BMC encoding method. Therefore, the output level is always inverted for each cell. Thus, a signal hardly includes a low-frequency component, and an effect of the low-frequency component on the input of the I/V conversion unit 3 is reduced. Consequently, even when the infrared detection device 1 is downsized, it is possible to suppress chattering which would otherwise occur due to a voltage between the input of the I/V conversion unit 3 and the output of the digital processing unit 5.

Second Embodiment

The infrared detection device 1A of the present embodiment is different from the infrared detection device 1 of the first embodiment in that the I/V conversion unit 3A operates in a differential circuit manner.

In the infrared detection device 1A of the present embodiment, the pyroelectric element 2 has a first end and a second end.

The operational amplifier of the I/V conversion unit 3A includes a first operational amplifier 311 having a first inverting input terminal and a first output terminal, and a second operational amplifier 312 having a second inverting input terminal and a second output terminal. The first inverting input terminal of the first operational amplifier 311 is connected to the first end of the pyroelectric element 2. The second inverting input terminal of the second operational amplifier 312 is connected to the second end of the pyroelectric element 2.

In addition, the capacitive element of the I/V conversion unit 3A includes a first capacitive element C11 and a second capacitive element C12. The first capacitive element C11 is interposed between the first inverting input terminal and the first output terminal. The second capacitive element C12 is interposed between the second inverting input terminal and the second output terminal.

The I/V conversion unit 3 includes a differential circuit (third operational amplifier) 34 configured to output a difference between a voltage of the first output terminal (an output voltage of the first operational amplifier 311) and a voltage of the second output terminal (an output voltage of the second operational amplifier 312). The voltage signal outputted from the I/V conversion unit 3 is defined as a signal representing a waveform of the difference.

Figure 10:
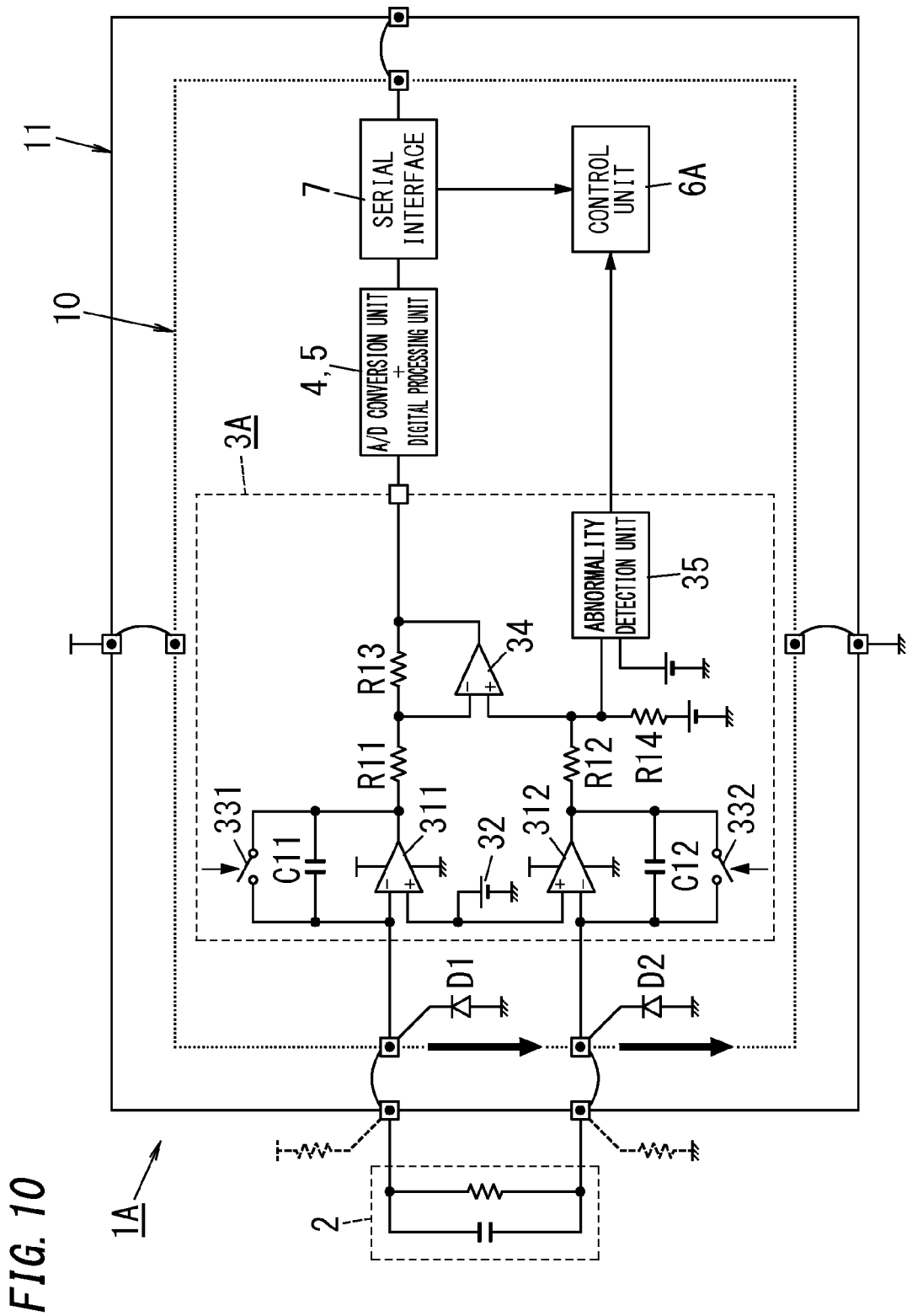
FIG. 10 is a schematic circuit diagram illustrating the configuration of the object detection device of the second embodiment.

In more detail, as shown in FIG. 10, in the present embodiment, the I/V conversion unit 3A includes the first operational amplifier 311 connected to one end of the pyroelectric element 2, and the second operational amplifier 312 connected to the other end of the pyroelectric element 2. Interposed between the output terminal and the inverting input terminal of the first operational amplifier 311 is the first capacitive element (first capacitor) C11 which serves as a capacitive element for constituting an AC feedback circuit. Interposed between the output terminal and the inverting input terminal of the second operational amplifier 312 is the second capacitive element (second capacitor) C12 which serves as a capacitive element for constituting an AC feedback circuit. The operational amplifiers 311 and 312 have the non-inverting input terminals connected to the reference power source 32 which supplies the reference voltage.

Further, there is a first reset switch 331 which is interposed between the output terminal and the inverting input terminal of the first operational amplifier 311 so as to be connected in parallel with the capacitor C11. There is a second reset switch 332 which is interposed between the output terminal and the inverting input terminal of the second operational amplifier 312 so as to be connected in parallel with the capacitor C12. The first and second reset switches 331 and 332 are turned on and off in accordance with the reset signal from the control unit 6.

Moreover, the I/V conversion unit 3A includes a differential amplifier circuit employing the third operational amplifier 34. This differential amplifier circuit outputs a voltage signal which is corresponding to a signal indicative of a difference between the output voltage of the first operational amplifier 311 and the output voltage of the second operational amplifier 312. For example, the first operational amplifier 311 has the output terminal connected to the inverting input terminal of the third operational amplifier 34 via a resistor R11. The second operational amplifier 312 has the output terminal connected to the non-inverting input terminal of the third operational amplifier 34 via a resistor R12. Interposed between the output terminal and the inverting input terminal of the third operational amplifier 34 is a resistor R13. The third operational amplifier 34 has the non-inverting input terminal connected via a resistor R14 to the reference voltage source configured to provide the reference voltage.

Besides, in FIG. 10, the A/D conversion unit 4 and the digital processing unit 5 are illustrated as one unit, and the digital processing unit 5 has an output side connected to a serial interface 7 configured to serially output the output of the digital processing unit 5. Further, in the instance shown in FIG. 10, the I/V conversion unit 3, the A/D conversion unit 4, the digital processing unit 5, the control unit 6A, and the serial interface 7 are provided as one-chip IC (Integrated Circuit) 10 and are housed in a case 11.

As described in the above, the I/V conversion unit 3A of the present embodiment includes, as the operational amplifier, the first operational amplifier 311 connected to one end (first end) of the pyroelectric element 2 and the second operational amplifier 312 connected to the other end (second end) of the pyroelectric element 2. The I/V conversion unit 3A outputs the voltage signal which is corresponding to the signal indicative of the difference between the output voltage of the first operational amplifier 311 and the output voltage of the second operational amplifier 312.

According to this configuration, the I/V conversion unit 3A outputs the voltage signal corresponding to the difference between the output voltages of the first and second operational amplifiers 311 and 312. Therefore, it is possible to cancel an in-phase component which may be caused by a leak current from the terminal of the pyroelectric element 2 to the substrate and a disturbance noise. In addition, the above configuration can suppress chattering which would otherwise occur due to a voltage between the input of the I/V conversion unit 3A and the output of the digital processing unit 5.

Further, the I/V conversion circuit 3A includes an abnormality detection circuit 35. The abnormality detection circuit 35 is configured to obtain at least one of the voltage of the first output terminal and the voltage of the second output terminal as a detection voltage, and judge whether or not the detection voltage is included in a predetermined range (normal range as mentioned below), and output an abnormality signal (abnormality detection signal) to the reset circuit 62 upon determining that the detection voltage is not included in the predetermined range. In the present embodiment, the reset circuit 62 of the control unit 6A is configured to output the reset signal to the reset switches 331 and 332 constituting the discharging circuit in response to receipt of the abnormality detection signal.

In other words, the I/V conversion unit 3A includes the abnormality detection unit (abnormality detection circuit) 35 configured to detect an abnormal value of at least one of the output voltages of the first operational amplifier 311 and the second operational amplifier 312. The abnormality detection unit 35 compares at least one of the output voltages of the first operational amplifier 311 and the second operational amplifier 312 with a predetermined fourth threshold and a predetermined fifth threshold (greater than the fourth threshold). Upon acknowledging that the output voltage of the operational amplifier 311 or 312 does not fall within the normal range defined by the fourth and fifth thresholds, the abnormality detection unit 35 determines that the output voltage of the operational amplifier 311 or 312 has the abnormal value, and outputs the abnormality signal (abnormality detection signal) to the control unit 6A.

The control unit 6A includes the abnormal voltage protection unit (reset circuit) 62. The abnormal voltage protection unit (reset circuit) 62 is configured to output the reset signal in response to receipt of the abnormality signal from the abnormality detection unit 35 so as to turn on the first and second reset switches 331 and 332 to reset the capacitors C11 and C12. In other words, the control unit 6A includes the abnormal voltage protection unit (reset circuit) 62 configured to reset the capacitive element (capacitor) C1 in response to occurrence of an event where at least one of the output voltages of the first operational amplifier 311 and the second operational amplifier 312 does not fall within the normal range defined by the fourth threshold and the fifth threshold. In brief, when at least one of the output voltages of the first operational amplifier 311 and the second operational amplifier 312 does not fall within the normal range defined by the fourth and fifth thresholds, the abnormal voltage protection unit resets the capacitors C11 and C12.

Besides, to compare the output voltage of the second operational amplifier 312 with the fourth and fifth thresholds, the abnormality detection unit 35 of the present embodiment monitors an electrical potential at a connection point of the resistor R12 and the resistor R14.

According to this configuration, when an abnormal increase or an abnormal decrease in the output voltage of the operational amplifier 311 or 312 occurs due to such as a leak current from the terminal of the pyroelectric element 2 to the substrate and a disturbance noise, the infrared detection device 1A can detect such abnormality at a first part (the I/V conversion unit 3) of a circuit thereof immediately. In the infrared detection unit 1A, when an abnormal increase or an abnormal decrease in the output voltage of the operational amplifier 311 or 312 occurs, the abnormal voltage protection unit resets the capacitors C11 and C12. Therefore, it is possible to avoid saturation of the output of the I/V conversion unit 3A which would otherwise occur due to an effect of the in-phase component.

The other configurations and functions of the present embodiment are same as those of the first embodiment.

Third Embodiment

Figure 11:
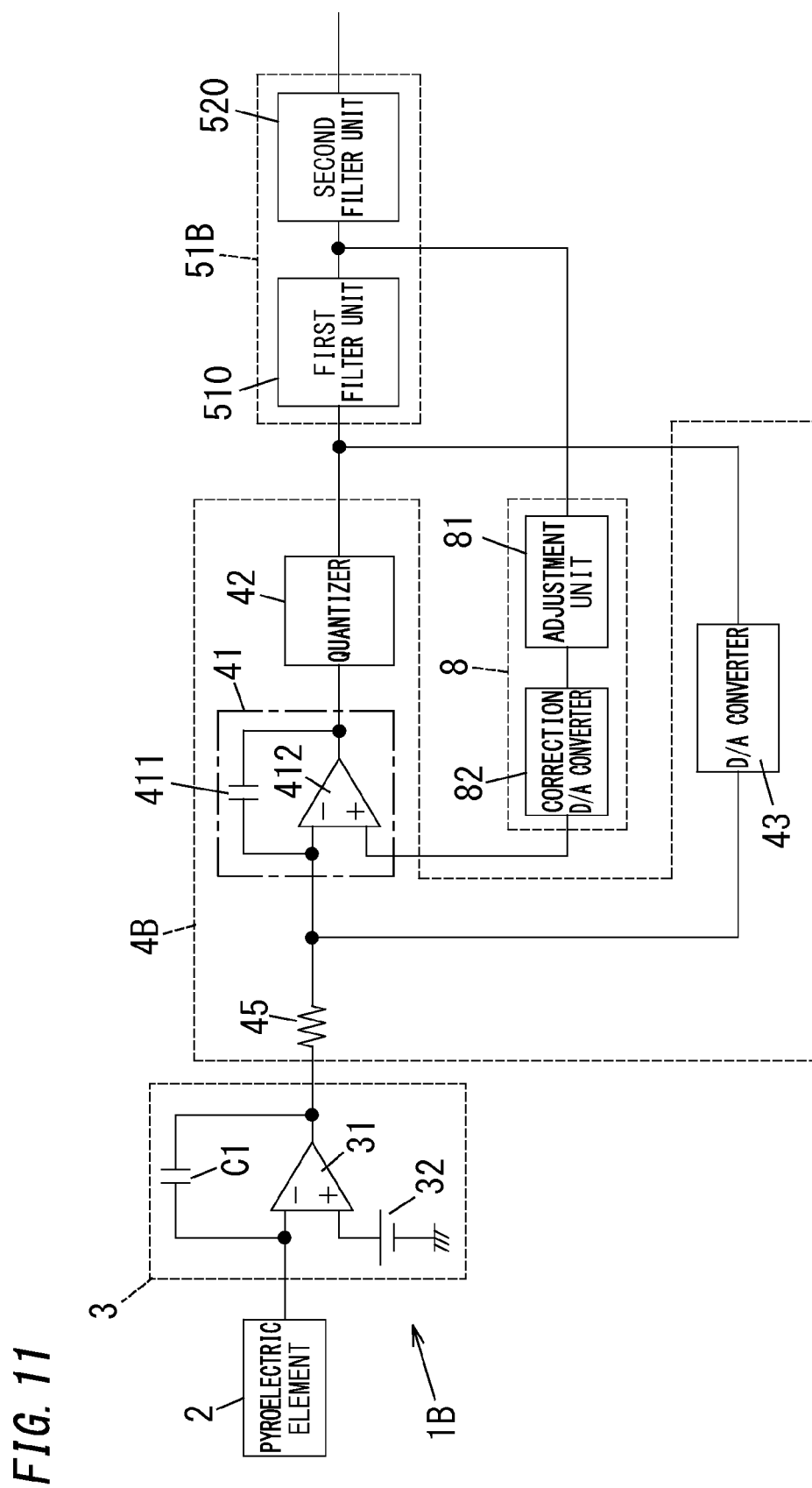
FIG. 11 is a schematic circuit diagram illustrating the configuration of the object detection device of the third embodiment.

As shown in FIG. 11, the object detection device (infrared detection device) 1B of the present embodiment includes the pyroelectric element 2, the I/V conversion circuit 3, the A/D conversion circuit 4B, the digital filter 51B, and a correction circuit 8.

The correction unit 8 includes an adjustment unit 81 and a correction D/A converter 82. The adjustment unit 81 is configured to create a correction digital signal indicative of a low-frequency component of the voltage signal based on the first digital signal outputted from the A/D conversion circuit 4B. The low-frequency component has a frequency not greater than a predetermined frequency, and the predetermined frequency is not greater than the lower limit (0.1 Hz in the present embodiment) of the detection frequency band. In the present embodiment, the predetermined frequency is identical to the lower limit and is 0.1 Hz. The correction D/A converter 82 is configured to convert the correction digital signal to a correction analog signal and output the correction analog signal to the A/D conversion circuit 4B.

The A/D conversion circuit 4B is configured to subtract the correction analog signal from the voltage signal and convert the resultant voltage signal to the first digital signal.

The A/D conversion circuit 4B includes an integrator 41, a quantizer 42, and a D/A converter 43, and a resistor 45.

The integrator 41 includes a third operational amplifier 412 and a third capacitive element 411. The third operational amplifier 412 has a third inverting input terminal, a third non-inverting input terminal, and a third output terminal. The third inverting input terminal is connected to the I/V conversion circuit via the resistor 45 to receive the voltage signal. The third capacitive element 411 is interposed between the third inverting input terminal and the third output terminal. The third non-inverting input terminal is connected to the correction D/A converter 82 to receive the correction analog signal. In other words, the correction D/A converter 82 is configured to provide the correction analog signal to the third non-inverting input terminal.

The quantizer 42 is configured to convert a voltage of the third output terminal of the third operational amplifier 412 to a digital value at predetermined resolution and output the digital value. The first digital signal is defined as a bit sequence indicative of the digital value outputted from the quantizer 42. In the present embodiment, the predetermined resolution of the quantizer 42 is one bit.

The D/A converter 43 is configured to, in response to receipt of the digital value from the quantizer 42, apply a voltage corresponding to the received digital value to the third inverting input terminal.

The digital filter 51B includes a first filter unit 510 and a second filter unit 520. The first filter unit 510 is configured to convert the first digital signal to a third digital signal represented by multiple bits and output the third digital signal. The second filter unit 520 is configured to create the second digital signal by subjecting the third digital signal to an arithmetic process.

In the present embodiment, the adjustment unit 81 of the correction unit 8 is configured to receive the third digital signal from the first filter unit 510. The adjustment unit 81 is configured to create the correction digital signal by subjecting the third digital signal to an arithmetic process.

The object detection device 1B further includes the judgment circuit 52 and the control unit 6, but they are not shown in FIG. 11. Additionally, also the discharging circuit 33 is not illustrated in FIG. 11.

In the following, the present embodiment is explained in detail.

Figure 12:
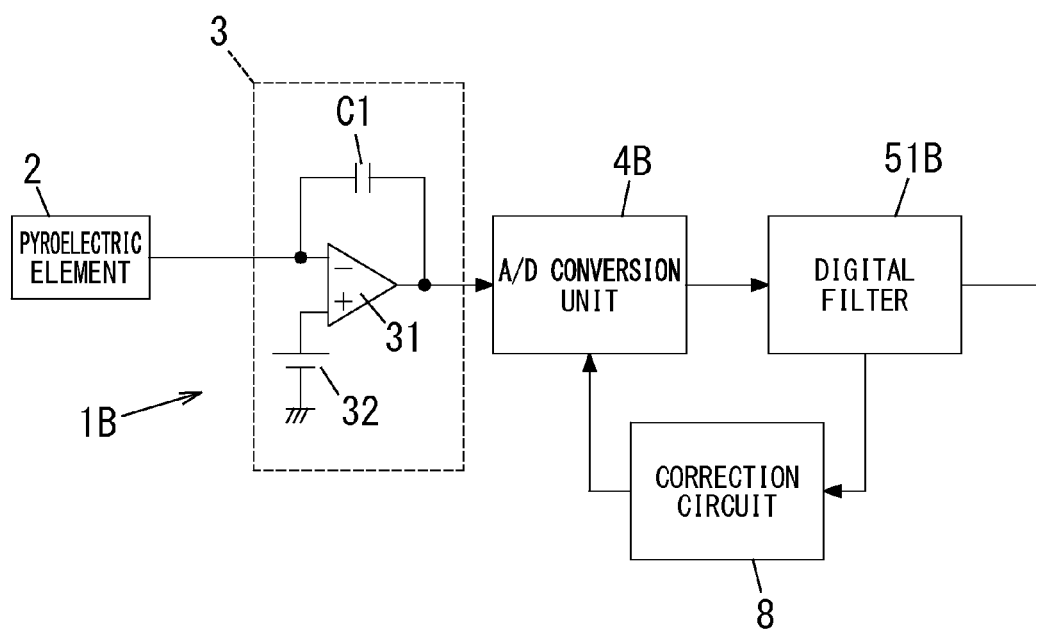
FIG. 12 is a schematic circuit diagram illustrating the configuration of the object detection device of the above third embodiment.

As shown in FIG. 12, the infrared detection device (object detection device) 1B of the present embodiment includes the pyroelectric element 2, the I/V conversion circuit 3 connected to the pyroelectric element 2, the A/D conversion unit 4B connected to the I/V conversion circuit 3, the digital filter 51B connected to the A/D conversion unit 4B, and the correction circuit 8.

The A/D conversion unit 4B includes the integrator 41, the quantizer 42, and the D/A converter 43. The integrator 41 is configured to integrate the input signal (the voltage signal of the I/V conversion circuit 3). The quantizer 42 is configured to quantize the output of the integrator 41. The D/A converter 43 is configured to convert the output of the quantizer 42 to the corresponding analog value. Besides, interposed between the I/V conversion circuit 3 and the integrator 41 is the resistor 45.

The integrator 41 includes the operational amplifier (third operational amplifier) 412 in which the capacitor (third capacitive element) 411 is interposed between the inverting input terminal (third inverting input terminal) and the output terminal (third output terminal) of the third operational amplifier 412. The third operational amplifier 412 receives the input signal (the voltage signal) from the I/V conversion circuit 3 at the inverting input terminal (third inverting input terminal). The quantizer 42 compares the output voltage (the voltage at the third output terminal) of the integrator 41 (that is, an integrated value) with a predetermined threshold, and converts the analog value indicative of the integrated value to the corresponding digital value. In the present embodiment, the quantizer 42 uses one threshold to convert the analog value to the corresponding digital value of one bit.

The D/A converter 43 converts a delay value to a corresponding analog value and provides the analog value to the inverting input terminal (third inverting input terminal) of the operational amplifier 412. The delay value is a value obtained by delaying a digital value converted at the quantizer 42 by one clock period. Thus, in the A/D conversion unit 4B, a value obtained by integrating a change (differential value) in the input signal varying with time is outputted from the quantizer 42 as the digital value.

The A/D conversion unit 4B converts an analog value to a corresponding digital value at the quantizer 42 unless amplitude of the inputted analog value does not fall within an input allowable range. When the analog signal having the amplitude which does not fall within the input allowable range is inputted, the output of the quantizer 42 is saturated.

The digital filter 51B functions as a digital bandpass filter having a passing band defined by a predetermined frequency band. In the present embodiment, the digital filter 51B has the passing band defined by a frequency band (e.g., about 0.1 Hz to 10 Hz) including a frequency of a current signal which the pyroelectric element 2 generates in response to detection of a human body.

As shown in FIG. 11, the digital filter 51B includes the first filter unit 510 connected to the output terminal of the A/D conversion unit 4B and the second filter unit 520 connected to the output terminal of the first filter unit 510. The first filter unit 510 serves as a low-pass filter. The second filter unit 520 serves as a high-pass filter and a low-pass filter. The first filter unit 510 and the second filter unit 520 constitute a BPF.

As mentioned in the above, the A/D conversion unit 4B is constituted by a ΔΣ A/D convertor. Such a ΔΣ A/D convertor performs oversampling to reduce a quantization error. The first filter unit 510 is configured to serve as a decimation filter designed to performs a process of reducing a sampling frequency of the digital data (first digital signal) outputted from the quantizer 42 (i.e., downsampling) to change the resolution of the digital data from one bit to multiple bits.

In a situation where an analog BPF is used as an alternative to the digital filter 51B, an electric component (e.g., a capacitor) having a relatively high circuit constant is necessary to pass a signal with a frequency in a range of 0.1 Hz to 10 Hz. Such an electric component is externally attached to an IC (integrated circuit). Therefore, according to this configuration, it is unable to provide a circuit part of the infrared detection device as a one-chip circuit. In contrast, since the infrared detection device 1B of the present embodiment employs the digital BPF as mentioned above, external electric components are unnecessary, and it is possible to form the circuit part of the infrared detection device as a one-chip circuit.

According to the infrared detection device 1B having the configuration explained in the above, the current signal outputted from the pyroelectric element 2 is converted to the corresponding voltage signal by the I/V conversion circuit 3, and thereafter is converted to the corresponding digital value by the A/D conversion unit 4B, and subsequently is inputted into the digital filter 51B. The digital filter 51B outputs the digital signal (second digital signal) corresponding to a component included in the frequency band (about 0.1 Hz to 10 Hz) of the current signal which the pyroelectric element 2 generates in response to detection of a human body, and the digital signal outputted from the digital filter 51B is inputted into the judgment circuit 52 subsequent to the digital filter 51B.

When an input (the voltage signal from the I/V conversion circuit 3) to the A/D conversion unit 4B includes a low-frequency component with a frequency not greater than the predetermined frequency, such an input signal to the A/D conversion unit 4B easily deviates from the input allowable range. In brief, when the current leakage occurs at the inverting input terminal of the operational amplifier 31 of the I/V conversion circuit 3 or a low-frequency fluctuation component is inputted into the I/V conversion circuit 3 from the pyroelectric element 2, the input to the A/D conversion unit 4B may include a low-frequency component. Such a low-frequency component may cause saturation of the output of the quantizer 42. For example, the low-frequency fluctuation component inputted into the I/V conversion circuit 3 from the pyroelectric element 2 is a component which is generated due to a change in the environment temperature irrespective of the presence or absence of the detection target (e.g., a human body) and is included in the output of the pyroelectric element 2. In the following explanation, the low-frequency component which has a frequency not greater than the predetermined frequency and has no relation to the detection target is also referred to as "undesired component".

It is considered that a high-pass filter is interposed between the I/V conversion circuit 3 and the A/D conversion unit 4B to reduce the undesired component included in the input to the quantizer 42. However, to decrease a cut-off frequency of the high-pass filter to eliminate the undesired component, the high-pass filter needs resistors and capacitors having relatively high circuit constants. Therefore, it is difficult to include the high-pass filter in the IC (integrated circuit). Therefore, in a configuration where the I/V conversion circuit 3, the A/D conversion unit 4B, and the digital filter 51B are not constituted by external parts but are included in the IC to form a one-chip circuit in a similar manner as the present embodiment, it is impossible to interpose the high-pass filter between the I/V conversion circuit 3 and the A/D conversion unit 4B.

In view of the above, the infrared detection device 1B of the present embodiment is provided with the correction circuit 8 designed to reduce the low-frequency component (undesired component) included in the input to the quantizer 42. The low-frequency component (undesired component) has a frequency not greater than the predetermined frequency. For example, in consideration of the frequency band (about 0.1 Hz to 10 Hz) of the current signal which the pyroelectric element 2 generates in response to the human body detection, the undesired component is defined as a low-frequency component having a frequency not greater than 0.1 Hz.

The correction unit 8 is connected to the digital filter 51B and the A/D conversion unit 4B. The correction unit 8 feeds back the undesired component from the digital filter 51B to the A/D conversion unit 4B for the purpose of reducing the undesired component in the output from the A/D conversion unit 4B. As shown in FIG. 11, the correction circuit 8 feeds back the undesired component from the output (third digital signal) from the first filter unit 510 serving as a part of the digital filter 51B to the non-inverting input terminal (third non-inverting input terminal) of the third operational amplifier 412 in the integrator 41.

As explained in detail, the correction unit 8 includes the adjustment unit 81 connected to the output side of the first filter unit 510 and the correction D/A converter (D/A conversion unit) 82 connected to the output side of the adjustment unit 81. The adjustment unit 81 is a digital low-pass filter having a cut-off frequency identical to the upper limit frequency (e.g., 0.1 Hz) of the undesired component. The adjustment unit 81 extracts only the digital signal (correction digital signal) corresponding to the undesired component from the output from the first filter unit 510 and outputs the extracted digital signal to the correction D/A converter 82. The correction D/A converter 82 converts the digital value (a value indicated by the correction digital signal) corresponding to the undesired component received from the adjustment unit 81 to the analog value (correction analog signal) and feeds back the analog value to the operational amplifier 412.

According to this configuration, the analog signal (correction analog signal) corresponding to the undesired component is fed back by the correction circuit 8 to the operational amplifier 412 of the integrator 41 as the feed back signal. Since inputted into the inverting input terminal (third inverting input terminal) of the operational amplifier 412 is the input signal from the I/V conversion circuit 3 (the voltage signal of the I/V conversion circuit 3), the undesired component is removed from the input signal (the voltage signal of the I/V conversion circuit 3) and the resultant signal is inputted into the quantizer 42. Therefore, it is possible to avoid the situation where the input signal to the A/D conversion unit 4B does not fall within the input allowable range due to the undesired component. Consequently, the input allowable range of the A/D conversion unit 4B can be extended.

Figure 13:
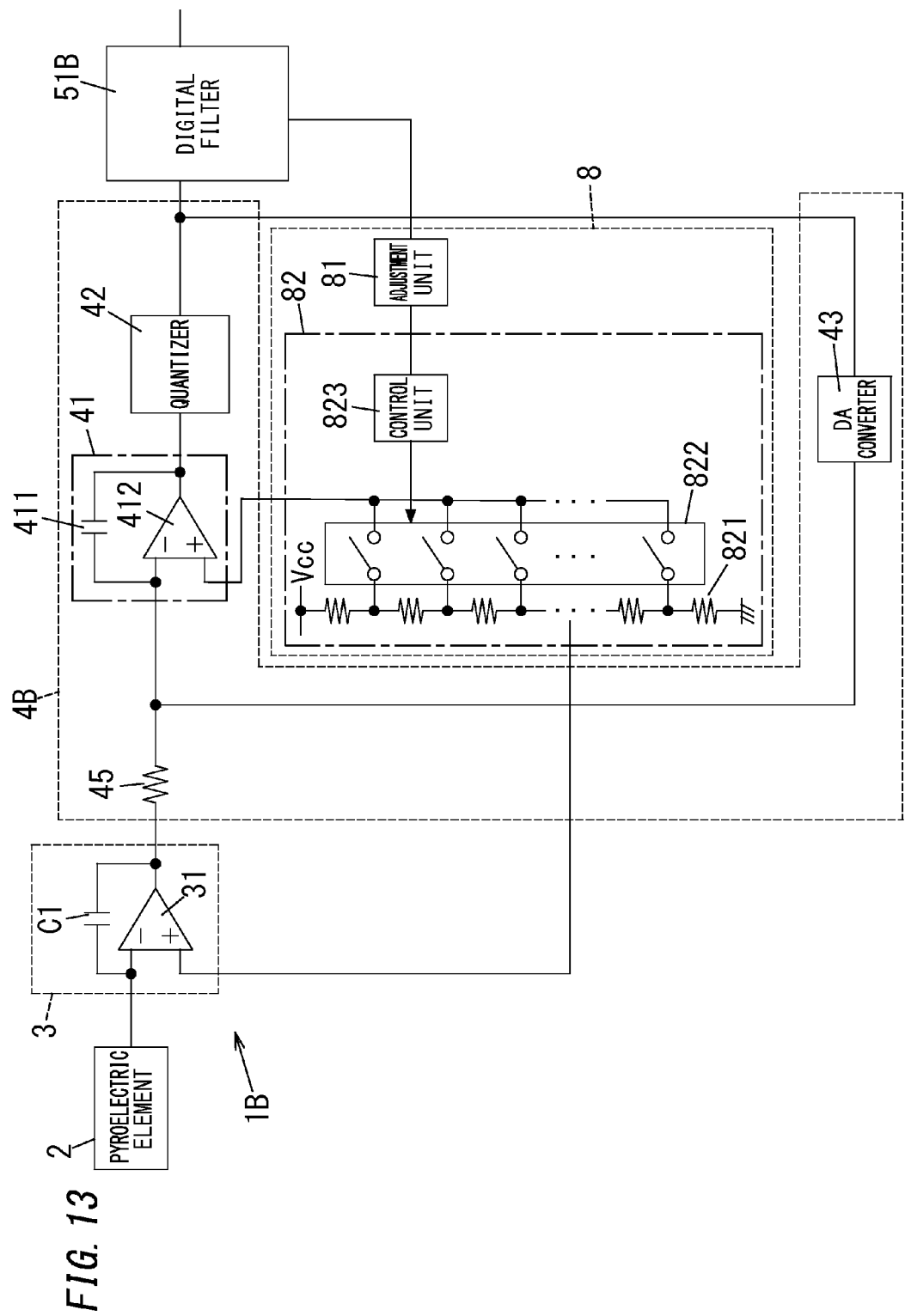
FIG. 13 is a schematic circuit diagram illustrating the configuration of the object detection device of the above third embodiment.

Next, a detailed explanation referring to FIG. 13 is made to the configuration of the correction D/A converter 82. The correction D/A converter 82 includes a resistor array 821, a multiplexer 822, and a control circuit 823. The resistor array 821 is constituted by connecting plural resistance elements in series. The multiplexer 822 selects a connection point to be connected to the integrator 41 from plural connection points of the resistor array 821. The control circuit 823 controls the multiplexer 822. Applied to the resistor array 821 is the constant DC voltage (internal power source voltage) Vcc. The plural resistance elements divide the reference voltage (internal power source voltage) Vcc such that different voltages are developed at the respective connection points. The control circuit 823 selects the connection point to be connected to the integrator 41 in accordance with the digital value outputted from the adjustment unit 81 such that the voltage having magnitude corresponding to the digital value (value indicated by the correction digital signal) outputted from the adjustment unit 81 is applied to the non-inverting input terminal (third non-inverting input terminal) of the operational amplifier 412.

In brief, the correction D/A converter 82 divides the DC voltage Vcc by use of the resistor array 821. When no fluctuation occurs in the input signal to the A/D conversion unit 4B, the correction D/A converter 82 selects the connection point to be connected to the integrator 41 by use of the control circuit 823 such that a predetermined voltage Vr is outputted to the integrator 41. When the fluctuation to the high voltage side occurs in the input signal due to the undesired component, the correction D/A converter 82 selects the connection point to be connected to the integrator 41 in accordance with the fluctuation such that the output voltage to the integrator 41 exceeds the voltage Vr. According to this operation, the analog signal (correction analog signal) corresponding to the undesired component is fed back to the operational amplifier 412.

The object detection device 1B of the present embodiment includes the internal power source having the predetermined voltage (DC voltage) Vcc. The correction D/A converter 82 is configured to create the correction analog signal by use of the predetermined voltage Vcc of the internal power source. The internal power source is electrically connected to the non-inverting input terminal of the operational amplifier 31 of the I/V conversion circuit 3 such that the reference voltage is applied to the non-inverting input terminal of the operational amplifier 31 of the I/V conversion circuit 3.

In other words, in the object detection device 1B, the I/V conversion circuit 3 includes the operational amplifier 31. The operational amplifier 31 has the inverting input terminal connected to the pyroelectric element 2. Interposed between the inverting input terminal and the output terminal of the operational amplifier 31 is the feedback element (capacitive element) C1. The reference voltage is applied to the non-inverting input terminal of the operational amplifier 31. The correction circuit 8 includes the D/A conversion unit (correction D/A converter) 82 configured to convert the digital value (value indicated by the correction digital signal) corresponding to the low-frequency component to the analog value (value indicated by the correction analog signal). A power supply unit for the correction D/A converter 82 is also used as a power supply unit for a reference power unit generating the reference voltage.

In brief, a power source unit which applies the DC voltage Vcc to the resistor array 821 is used as the power supply unit for the reference power source 32 (see FIG. 11) applying the reference voltage to the operational amplifier 31 of the I/V conversion circuit 3. In other words, the power supply unit for the correction D/A converter 82 serves as the power supply unit for the reference power source 32 generating the reference voltage applied to the operational amplifier 31. For example, with connecting the non-inverting input terminal of the operational amplifier 31 to any one of the plural connection points of the resistor array 821, the divided voltage of the resistor array 821 is applied to the operational amplifier 31 as the reference voltage.

According to this configuration, the reference voltage used for defining the operating point of the output from the I/V conversion unit 3 and the DC voltage Vcc applied to the resistor array 821 are generated by the same power supply unit. Therefore, when a noise component is included in the output of the power supply unit, the noise component causes effects on the outputs of the I/V conversion circuit 3 and the correction D/A converter 82, and thus the effects are canceled at the integrator 41. Consequently, it is possible to avoid a situation where the noise component which occurs in the output of the reference voltage source unit 33 causes an effect on the input to the quantizer 42. As a result, the reliability of the output of the A/D conversion unit 4B is improved.

The correction circuit 8 reduces the undesired component having the frequency not greater than the predetermined frequency included in the output of the A/D conversion unit 4. Therefore, with regard to a relation between the input and the output of the A/D conversion unit 4B, the correction circuit 8 is considered to be a high-pass filter. In the correction circuit 8, the cut-off frequency of the adjustment unit 81 may be adjusted such that with regard to the output from the A/D conversion unit 4B the low-frequency component having the frequency not greater than the cut-off frequency of the high-pass filter constituting a part of the digital filter 51B is reduced.

In other words, in a situation where the digital filter 51B includes the low-pass filter and the high-pass filter, the correction circuit 8 may be configured to reduce the low-frequency component in the output from the A/D conversion unit 4B, which has the frequency not greater than the cut-off frequency of the high-pass filter. In other words, the correction circuit 8 may be used as a part of the high-pass filter.

In this configuration, the high-pass filter constituted by the correction unit 8 functions as one of the high-pass filters constituting the digital filter 51B. Therefore, it is possible to reduce the number of the filters constituting the digital filter 51B. For example, when the five filters are necessary for human body detection, it is sufficient that the digital filter 51B includes the four filters.

Next, an explanation referring to FIG. 14 is made to an operation of the object detection device (infrared detection device) 1B. FIG. 14 shows inputs to the quantizer 42 in a situation where a fluctuation component (undesired component) having the frequency not greater than the predetermined frequency occurs in the input from the pyroelectric element 2 to the I/V conversion circuit 3 due to a change in the environment temperature of the pyroelectric element 2.

First, an explanation is made to an instance where the correction circuit 8 is not provided. In this instance, as shown in FIG. 14 (a), the undesired component is included in the input to the quantizer 42 in addition to the detection target component (e.g., a component outputted from the pyroelectric element 2 in response to movement of a human body). Therefore, the input to the quantizer 42 is greatly fluctuated due to the undesired component. Not to saturate the output from the quantizer 42, the input allowable range R1 of the A/D conversion unit 4B is required to be a relatively wide range.

In contrast, when the correction circuit 8 is provided in a similar manner as the present embodiment, as shown in FIG. 14 (a), with regard to the input to the quantizer 42, the undesired component other than the detection target component is greatly reduced by the correction unit 8. Therefore, the situation that the input to the quantizer 42 is greatly fluctuated due to the undesired component is prevented. Even when the input allowable range R1 of the A/D conversion unit 4B is selected to be a relatively narrow range, the output of the quantizer 42 is hardly saturated.

As mentioned in the above, the object detection device 1B of the present embodiment includes the correction circuit 8. The correction circuit 8 includes the adjustment unit 81 and the correction D/A converter 82. The adjustment unit 81 is configured to create the correction digital signal indicative of the low-frequency component in the voltage signal based on the first digital signal. The low-frequency component is defined as a component having the frequency not greater than the predetermined frequency. The predetermined frequency is not greater than the lower limit. The correction D/A converter 82 is configured to convert the correction digital signal to the correction analog signal and output the correction analog signal to the A/D conversion circuit 4B. The A/D conversion circuit 4B is configured to subtract the correction analog signal from the voltage signal and convert the resultant voltage signal to the first digital signal.

In other words, the object detection device 1B of the present embodiment includes the pyroelectric element 2, the I/V conversion circuit 3, the A/D conversion unit 4B, the digital filter 51B, and the correction unit 8. The I/V conversion circuit 3 is configured to convert the current signal outputted from the pyroelectric element 2 to the corresponding voltage signal. The A/D conversion unit 4B is configured to convert the analog value outputted from the I/V conversion circuit 3 to the corresponding digital value and output the resultant digital value in a serial manner. The digital filter 51B is configured to transmit the signal component in the output from the A/D conversion unit 4B which has the frequency included in the predetermined frequency band. The correction circuit 8 is configured to feed back the low-frequency component from the digital filter 51B to the A/D conversion unit 4B so as to reduce the low-frequency component which is included in the output from the A/D conversion unit 4B and has the frequency not greater than the predetermined frequency.

According to the object detection device 1B of the present embodiment as explained in the above, the correction circuit 8 feeds back the undesired component from the digital filter 51B to the A/D conversion unit 4B. Therefore, it is possible to reduce the low-frequency component (undesired component) with the frequency not greater than the predetermined frequency included in the input to the quantizer 42. In brief, even when the undesired low-frequency component with no relation to the detection target is included in the output current from the pyroelectric element 2 due to a change in the environment temperature, the object detection device (infrared detection device) 1B of the present embodiment can regard the undesired low-frequency component as the undesired component and eliminate the same.

Therefore, it is possible to avoid the situation where the input signal to the A/D conversion unit 4B is out of the input allowable range due to the undesired low-frequency component. Consequently, with narrowing the input allowable range R2 of the A/D conversion unit 4B (i.e., with selecting a relatively narrow range as the dynamic range of the input of the quantizer 42), the quantizer 42 can convert with high accuracy a weak input signal such as the voltage signal based on the output of the pyroelectric element 2. Alternatively, when the quantizer 42 of the present embodiment has the substantially same accuracy as that of an instance devoid of the correction unit 8, the circuit scale of the object detection device 1B can be reduced in comparison with the above instance, and then the object detection device 1B can be downsized.

Further, in the configuration of the present embodiment, the input resistor connected to the input terminal of the I/V conversion circuit 3 is unnecessary. Therefore, in contrast to the prior infrared detection device, a situation where the S/N ratio of the I/V conversion circuit 3 is reduced by the noise component generated at the input resistor can be avoided. In brief, the object detection device 1B of the present embodiment can suppress the effect of the undesired low-frequency component without reducing the S/N ratio of the I/V conversion circuit 3.

In the object detection device 1B, the digital filter 61B includes the low-pass filter and the high-pass filter. The correction circuit 8 extracts the low-frequency component from the output from the low-pass filter and feeds back the extracted low-frequency component to the A/D conversion unit 4B. In the present embodiment, the correction unit 8 extracts the undesired component from the output from the first filter unit 510 which functions as the decimation filter and constitutes the low-pass filter of the digital filter 61B. Further, the correction unit 8 feeds back the extracted undesired component to the A/D conversion unit 4B. Therefore, the first filter unit 510 is used as a filter for extracting the undesired component in the correction unit 8. With using the same circuit for different purposes, the configuration of the object detection device 1B can be simplified.

In the object detection device 1B, the A/D conversion unit 4B includes the integrator 41 and the quantizer 42. The integrator 41 is configured to integrate the analog value. The quantizer 42 is configured to quantize the output of the integrator 41. The integrator 41 includes the third operational amplifier 412 in which the capacitive element (third capacitive element) 411 is connected between the inverting input terminal (third inverting input terminal) and the output terminal (third output terminal). The output (voltage signal) from the I/V conversion circuit 3 is inputted into the inverting input terminal (third inverting input terminal) of the third operational amplifier 412. The output (correction analog signal) from the correction circuit 8 is fed back to the non-inverting input terminal (third non-inverting input terminal) of the third operational amplifier 412.

In brief, in the present embodiment, the output (voltage signal) of the I/V conversion circuit 3 is inputted into the inverting input terminal of the operational amplifier 412 of the integrator 41 constituting a part of the A/D conversion unit 4B. The output (correction analog signal) of the correction unit 8 is fed back to the non-inverting input terminal of the operational amplifier 412. Therefore, the correction unit 8 can feed back the undesired component via an electric path separated from an electric path through which the signal (voltage signal) is inputted into the integrator 41 from the I/V conversion circuit 3. Consequently, the accuracy of the A/D conversion unit 4B can be improved.

In the present embodiment, the A/D conversion unit 4B operates in a $\Delta\Sigma$ manner. In brief, a $\Delta\Sigma$ A/D converter is adopted as the A/D conversion unit 4B including the integrator 41 configured to integrate the analog value. Therefore, the A/D conversion unit 4B can have the relatively high accuracy yet the circuit part of the object detection device 1B can be provided as an IC (integrated circuit). Further, the undesired component fed back to the input to the quantizer 42 by the correction unit 8 is reduced by the integrator 41 of the A/D conversion unit 4B. Thus, it is unnecessary to provide, in addition to the A/D conversion unit 4B, a component configured to reduce the undesired component which is fed back.

Figure 15:
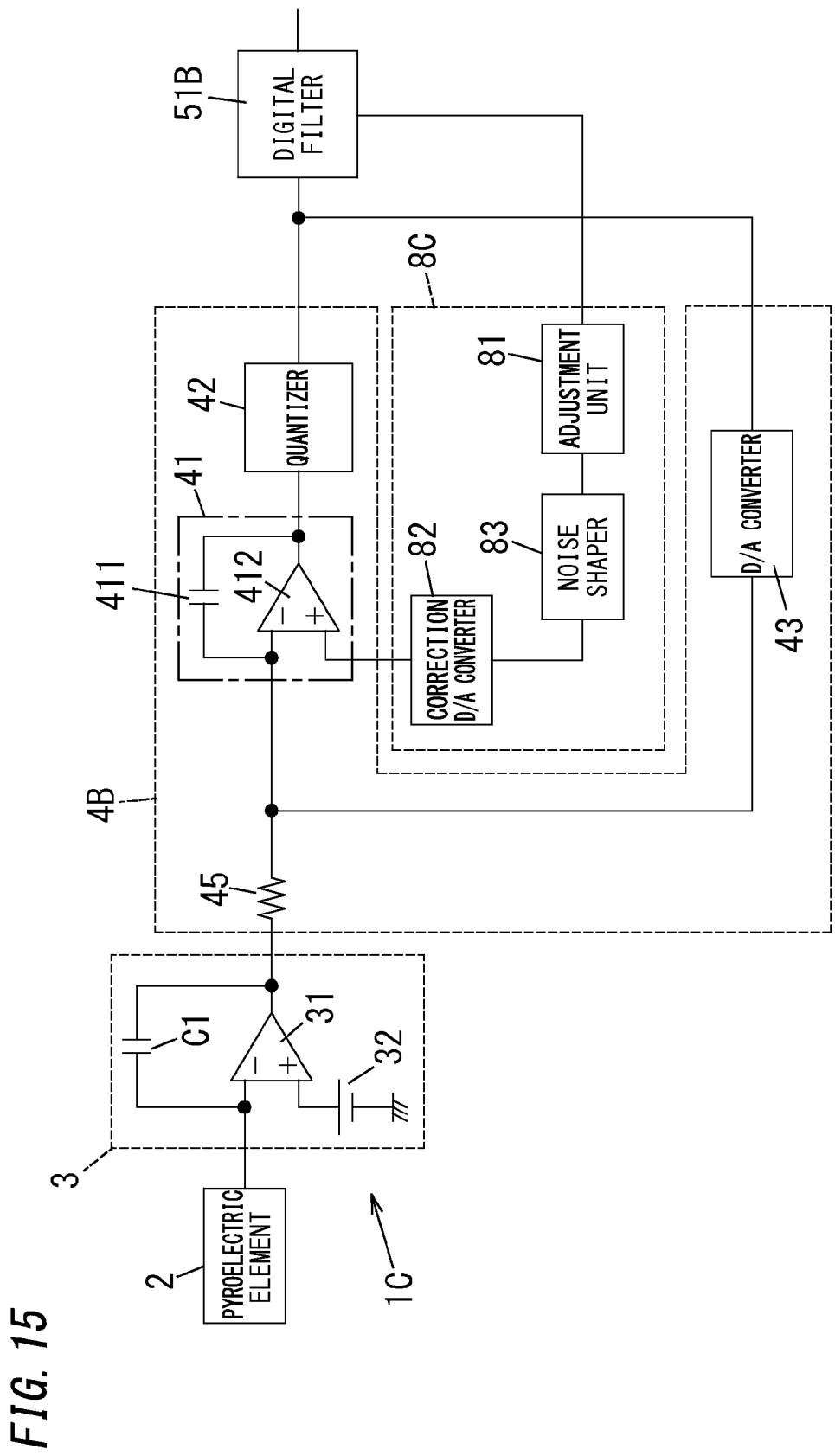
FIG. 15 is a schematic circuit diagram illustrating the other configuration of the object detection device of the above third embodiment.

FIG. 15 illustrates the object detection device 1C of a modification of the present embodiment. The correction unit 8 shown in FIG. 15 includes a noise shaper 83 interposed between the adjustment unit 81 and the correction D/A converter 82. The noise shaper 83 is configured to subject the output of the adjustment unit 81 to a noise shaping process. In this configuration, the correction D/A converter 82 converts the digital value corresponding to the undesired component which is subjected to the noise shaping process by the noise shaper 83, to the corresponding analog value. Subsequently, the correction D/A converter 82 feeds back the analog value to the operational amplifier 412.

In brief, the object detection device 1C of the modification is different from the object detection device 1B in the correction circuit 8C. The correction circuit 8C includes the noise shaper 83. The noise shaper 83 is configured to subject the correction digital signal to a noise shaping process to create a noise-shaped correction digital signal and output the noise-shaped correction digital signal to the correction D/A converter 82. The correction D/A converter 82 is configured to convert the noise-shaped correction digital signal to the correction analog signal.

In other words, the correction circuit 8C includes the adjustment unit 81 configured to transmit the low-frequency component, the noise shaper 83 configured to subject the output (correction digital signal) of the adjustment unit 81 to the noise shaping process, and the D/A conversion unit (correction D/A converter) 82 configured to convert the output of the noise shaper 83 to the corresponding analog value.

Besides, in the present embodiment, the $\Delta\Sigma$ A/D converter exemplifies the A/D conversion unit 4B. However, the A/D conversion unit 4B may be an A/D converter different from the $\Delta\Sigma$ A/D converter.

Fourth Embodiment

Figure 16:
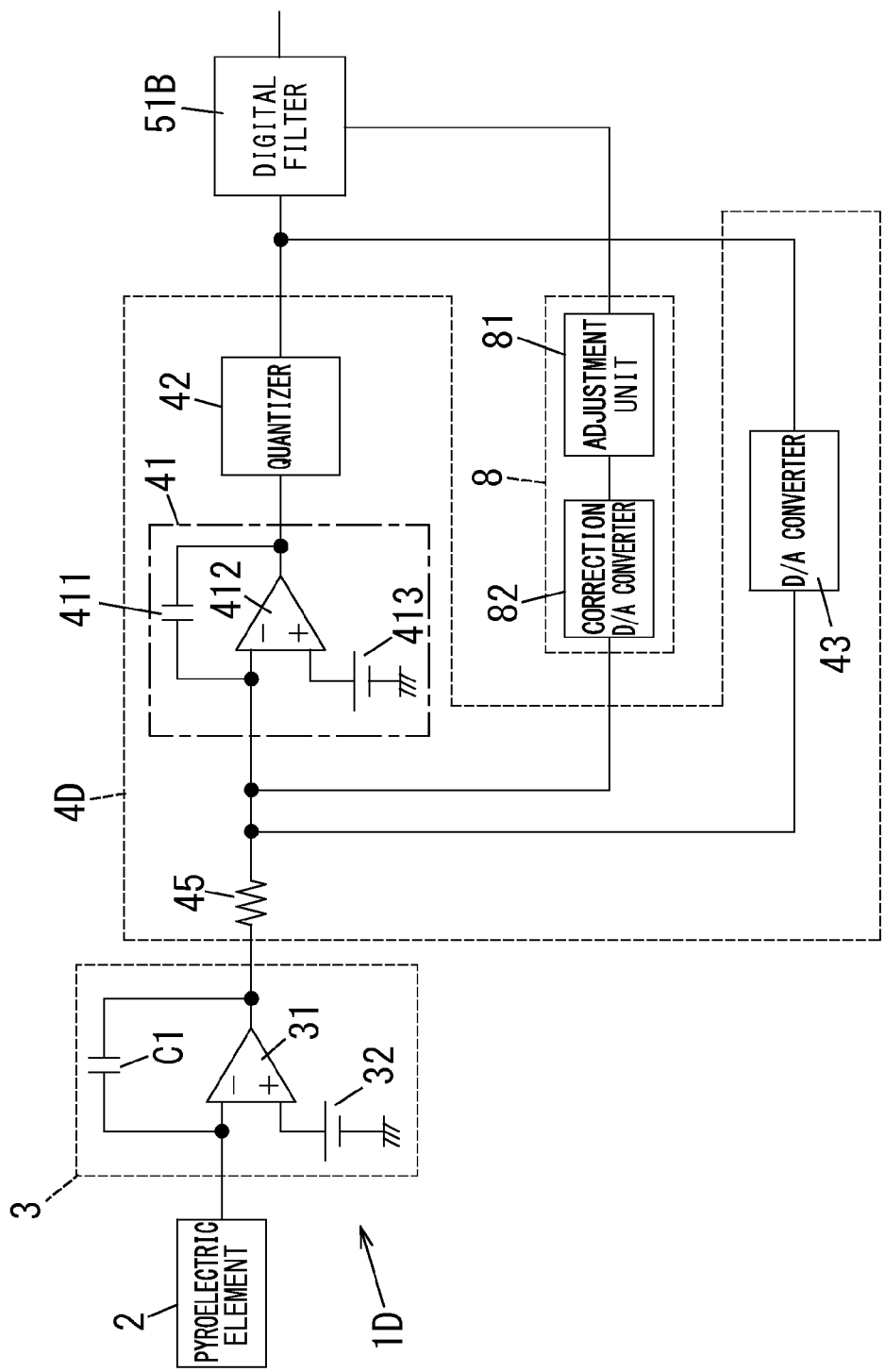
FIG. 16 is a schematic circuit diagram illustrating the configuration of the object detection device of the fourth embodiment.

As shown in FIG. 16, the object detection device (infrared detection device) 1D is different from the object detection devices 1B and 1C of the third embodiment in that the output from the correction circuit 8 is fed back to the inverting input terminal (third inverting input terminal) of the operational amplifier 412 in the integrator 41 constituting a part of the A/D conversion unit 4D. In the following, configurations common to the present embodiment and the third embodiment are designated by the same reference numerals and no explanations thereof are deemed necessary.

In brief, in the object detection device 1D of the present embodiment, in a similar manner as the third embodiment, the A/D conversion unit 4B includes the integrator 41, the quantizer 42, the D/A converter 43, and the resistor 45.

The integrator 41 includes the third operational amplifier 412 and the third capacitive element 411. The third operational amplifier 412 has the third inverting input terminal, the third non-inverting input terminal, and the third output terminal. The third inverting input terminal is connected to the I/V conversion circuit 3 via the resistor 45 to receive the voltage signal. The third capacitive element 411 is interposed between the third inverting input terminal and the third output terminal.

In contrast to the third embodiment, the third inverting input terminal in the objet detection device 1D of the present embodiment is connected to the correction D/A converter 82 to receive the correction analog signal. In other words, the correction D/A converter 82 is configured to provide the correction analog signal to the third inverting input terminal.

In other words, in the object detection device 1D of the present embodiment, the A/D conversion unit 4D includes the integrator 41 and the quantizer 42. The integrator 41 is configured to integrate the analog value. The quantizer 42 is configured to quantize the output of the integrator 41. The integrator 41 includes the third operational amplifier 412 in which the capacitive element (third capacitive element) 411 is connected between the inverting input terminal (third inverting input terminal) and the output terminal (third output terminal). The output from the I/V conversion circuit 3 is inputted into the inverting input terminal (third inverting input terminal) of the third operational amplifier 412. The output (correction analog signal) from the correction circuit 8 is fed back to the inverting input terminal (third inverting input terminal) of the third operational amplifier 412.

In brief, in the present embodiment, the operational amplifier 412 has the non-inverting input terminal (third non-inverting input terminal) connected to the reference voltage source unit 413 configured to generate the reference voltage. The correction circuit 8 provides the output (correction analog signal) to the inverting input terminal (third inverting input terminal) of the operational amplifier 412. Accordingly, inputted into the inverting input terminal (third inverting input terminal) of the operational amplifier 412 is the signal (correction analog signal) outputted from the correction unit 8. Besides, the reference voltage source unit 413 may serve as the reference voltage source 32 of the I/V conversion circuit 3.

According to the object detection device (infrared detection device) 1D of the present embodiment as explained in the above, it is sufficient that the output from the correction unit 8 is provided to the input terminal (i.e., the inverting input terminal of the operational amplifier 412) of the integrator 41 which is provided as a first component of the A/D conversion unit 4D. Therefore, there is no need to directly connect the output terminal of the correction unit 8 to the non-inverting input terminal of the operational amplifier 412. Consequently, although the correction circuit 8 is added, a general-purpose A/D converter provided as an IC (integrated circuit) can be adopted as the A/D conversion unit 4D.

The other configurations and functions of the present embodiment are the same as those of the third embodiment.

The invention claimed is:
1. An object detection device for detecting an object in a target space, said object detection device comprising:

a pyroelectric element configured to output a current signal in response to a change in an amount of infrared light received from the target space;

an I/V conversion circuit including an operational amplifier connected to said pyroelectric element, a capacitive element connected to said operational amplifier to serve as a feedback circuit, and a discharging circuit for discharging said capacitive element, said I/V conversion circuit being configured to convert the current signal to a voltage signal and output the voltage signal;

an A/D conversion circuit configured to convert the voltage signal to a first digital signal and output the first digital signal;

a digital filter configured to extract a detection component having a frequency included in a frequency band associated with the object, from a waveform represented by the first digital signal, by subjecting the first digital signal to an arithmetic processing, and create a second digital signal representing a waveform of the detection component, and output the second digital signal;

a judgment circuit configured to judge, based on the second digital signal, whether or not the object exists in the target space; and a control unit configured to control said discharging circuit in such a manner to eliminate a low-frequency component having a frequency not greater than a predetermined frequency from the voltage signal, the predetermined frequency being not greater than a lower limit of the frequency band, wherein said control unit is configured to control said discharging circuit based on a reset period corresponding to the predetermined frequency to discharge the electric charges stored in said capacitive element.

2. An object detection device as set forth in claim 1, wherein said control unit includes an oscillation circuit and a reset circuit, and said oscillation circuit is configured to create a pulse signal each time the reset period elapses and output the pulse signal to said reset circuit, and said reset circuit is configured to create a reset signal based on the pulse signal and output the reset signal to said discharging circuit, and said discharging circuit is configured to form a path for discharging the electric charges stored in said capacitive element in response to receipt of the reset signal.

3. An object detection device as set forth in claim 2, wherein said control unit includes a zero crossing detection circuit configured to judge whether or not a magnitude of the waveform represented by the second digital signal is identical to a predetermined value, and to, upon determining the magnitude of the waveform represented by the second digital signal is identical to the predetermined value, output a zero crossing detection signal to said reset circuit, and said reset circuit is configured to, in response to first receipt of the zero crossing detection signal subsequent to the receipt of the pulse signal, to output the reset signal to said discharging circuit, and the predetermined value is defined as a value corresponding to a magnitude of the voltage signal obtained when electric charges are not stored in said capacitive element.

4. An object detection device as set forth in claim 3, wherein said reset circuit is configured to, unless receiving the zero crossing detection signal before a lapse of predetermined time from the receipt of the pulse signal, output the reset signal to said discharging circuit after a lapse of the predetermined time.

5. An object detection device as set forth in claim 1, wherein said control unit includes an abnormality judgment circuit configured to judge whether or not a magnitude of the waveform represented by the second digital signal continuously exceeds a predetermined threshold for a prescribed time period, and to, upon determining the magnitude of the waveform represented by the second digital signal continuously exceeds the predetermined threshold for the prescribed time period, output an abnormality signal to said reset circuit, and said reset circuit is configured to output the reset signal to said discharging circuit in response to receipt of the abnormality signal.

6. An object detection device as set forth in claim 2, wherein said judgment circuit is configured to compare a magnitude of the wavelength represented by the second digital signal with a judgment value, and to, upon determining that the magnitude of the wavelength represented by the second digital signal exceeds the judgment value, conclude the object exists, and said control unit includes an inhibition circuit configured to judge whether or not the magnitude of the wavelength represented by the second digital signal exceeds an inhibition value less than the judgment value, and to output an inhibition signal to said reset circuit upon determining that the magnitude of the wavelength represented by the second digital signal exceeds the inhibition value, and to output a cancel signal to said reset circuit upon determining that the magnitude of the wavelength represented by the second digital signal does not exceed the inhibition value, and said reset circuit is configured such that, once said reset circuit receives the inhibition signal, said reset circuit does not output the reset signal unless receiving the cancel signal.

7. An object detection device as set forth in claim 2, wherein said A/D conversion circuit has an upper limit of the magnitude of the voltage signal which said A/D conversion circuit can convert, and said control unit includes a protection circuit configured to judge whether or not the magnitude of the voltage signal exceeds a border value not greater than the upper limit, and to output an excess signal to said reset circuit upon determining the magnitude of the voltage signal exceeds the border value, and said reset circuit is configured to output the reset signal to said discharging circuit in response to receipt of the excess signal.

8. An object detection device as set forth in claim 1, wherein said pyroelectric element has a first end and a second end, and said operational amplifier includes a first operational amplifier having a first inverting input terminal and a first output terminal, and a second operational amplifier having a second inverting input terminal and a second output terminal, and said first inverting input terminal is connected to said first end, and said second inverting input terminal is connected to said second end, and said capacitive element includes a first capacitive element and a second capacitive element, and said first capacitive element is interposed between said first inverting input terminal and said first output terminal, and said second capacitive element is interposed between said second inverting input terminal and said second output terminal, and said I/V conversion circuit includes a differential circuit configured to output a difference between a voltage of said first output terminal and a voltage of said second output terminal, and said voltage signal is defined as a signal representing a waveform of the difference.

9. An object detection device as set forth in claim 8, wherein said I/V conversion circuit includes an abnormality detection circuit, said abnormality detection circuit is configured to obtain at least one of the voltage of said first output terminal and the voltage of said second output terminal as a detection voltage, and judge whether or not the detection voltage is included in a predetermined range, and output an abnormality detection signal to said reset circuit upon determining that the detection voltage is not included in the predetermined range, and said reset circuit is configured to output the reset signal to said discharging circuit in response to receipt of the abnormality detection signal.

10. An object detection device as set forth in claim 1 further comprising a correction circuit, wherein said correction circuit includes:

an adjustment unit configured to create a correction digital signal indicative of a low-frequency component having a frequency not greater than a predetermined frequency not greater than the lower limit of the voltage signal based on the first digital signal; and a correction D/A converter configured to convert the correction digital signal to a correction analog signal and output the correction analog signal to said A/D conversion circuit, and said A/D conversion circuit is configured to subtract the correction analog signal from the voltage signal and convert the resultant voltage signal to the first digital signal.

11. An object detection device as set forth in claim 10, wherein said A/D conversion circuit includes an integrator, a quantizer, and a D/A converter, and said integrator includes a third operational amplifier and a third capacitive element, and said third operational amplifier has a third inverting input terminal connected to said I/V conversion circuit to receive the voltage signal, a third non-inverting input terminal, and a third output terminal, and said third capacitive element is interposed between said third inverting input terminal and said third output terminal, and said quantizer is configured to convert a voltage of said third output terminal to a digital value at predetermined resolution and output the digital value, and the first digital signal is defined as a bit sequence indicative of the digital value outputted from said quantizer, and said D/A converter is configured to, in response to receipt of the digital value from said quantizer, apply a voltage corresponding to the received digital value to said third inverting input terminal, and said correction D/A converter is configured to provide the correction analog signal to said third non-inverting input terminal.

12. An object detection device as set forth in claim 11, wherein the predetermined resolution is one bit, and said digital filter includes a first filter unit configured to convert the first digital signal to a third digital signal represented by multiple bits and output the third digital signal, and a second filter unit configured to create the second digital signal by subjecting the third digital signal to an arithmetic process, and said adjustment unit is configured to create the correction digital signal by subjecting the third digital signal to an arithmetic process.

13. An object detection device as set forth in claim 10, wherein said correction circuit includes a noise shaper configured to subject the correction digital signal to a noise shaping process to create a noise-shaped correction digital signal and output the noise-shaped correction digital signal to said correction D/A converter, and said correction D/A converter is configured to convert the noise-shaped correction digital signal to the correction analog signal.

14. An object detection device as set forth in claim 10 further comprising an internal power source having a predetermined voltage, wherein said correction D/A converter is configured to create the correction analog signal by use of the predetermined voltage of said internal power source, and said operational amplifier has a non-inverting input terminal, an inverting input terminal, and an output terminal, and said capacitive element is interposed between said non-inverting input terminal and said output terminal, and said inverting input terminal is connected to said pyroelectric element, and said internal power source is electrically connected to said non-inverting input terminal such that a reference voltage is applied to said non-inverting input terminal.

15. An object detection device as set forth in claim 10, wherein said A/D conversion circuit includes an integrator, a quantizer, and a D/A converter, and said integrator includes a third operational amplifier and a third capacitive element, and said third operational amplifier has a third inverting input terminal connected to said I/V conversion circuit to receive the voltage signal, a third non-inverting input terminal receiving a reference voltage, and a third output terminal, and said third capacitive element is interposed between said third inverting input terminal and said third output terminal, and said quantizer is configured to convert a voltage of said third output terminal to a digital value at predetermined resolution and output the digital value, and the first digital signal is defined as a bit sequence indicative of the digital value outputted from said quantizer, and said D/A converter is configured to, in response to receipt of the digital value from said quantizer, apply a voltage corresponding to the received digital value to said third inverting input terminal, and said correction D/A converter is configured to provide the correction analog signal to said third inverting input terminal.

16. An object detection device as set forth in claim 1, wherein
    said A/D conversion circuit is configured to convert the voltage signal to the first digital signal based on $\Delta\Sigma$ conversion.

17. An object detection device as set forth in claim 1, wherein
    said digital filter is configured to output the digital value indicative of the second digital signal in a serial method.

18. An object detection device as set forth in claim 17, wherein
    the serial method is a BMC method.

* * * * *